(12) United States Patent
Seo

(10) Patent No.: US 12,230,328 B2
(45) Date of Patent: Feb. 18, 2025

(54) SEMICONDUCTOR DEVICE

(71) Applicant: Samsung Electronics Co., Ltd., Suwon-si (KR)

(72) Inventor: Hyun Seo, Goyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 231 days.

(21) Appl. No.: 17/868,900

(22) Filed: Jul. 20, 2022

(65) Prior Publication Data

US 2023/0162797 A1    May 25, 2023

(30) Foreign Application Priority Data

Nov. 25, 2021 (KR) .................. 10-2021-0164339
Feb. 4, 2022 (KR) .................. 10-2022-0014634

(51) Int. Cl.
| | |
|---|---|
| G11C 16/04 | (2006.01) |
| G11C 16/08 | (2006.01) |
| G11C 16/10 | (2006.01) |
| H10B 43/10 | (2023.01) |
| H10B 43/27 | (2023.01) |
| H10B 43/35 | (2023.01) |
| H10B 43/40 | (2023.01) |

(52) U.S. Cl.
CPC .......... *G11C 16/10* (2013.01); *G11C 16/0483* (2013.01); *G11C 16/08* (2013.01); *H10B 43/10* (2023.02); *H10B 43/27* (2023.02); *H10B 43/35* (2023.02); *H10B 43/40* (2023.02)

(58) Field of Classification Search
CPC ...... G11C 16/10; G11C 16/0483; G11C 16/08
See application file for complete search history.

(56) References Cited

U.S. PATENT DOCUMENTS

| | | |
|---|---|---|
| 7,679,133 B2 | 3/2010 | Son et al. |
| 7,952,929 B2 | 5/2011 | Kim et al. |
| 8,514,621 B2 | 8/2013 | Choi et al. |
| 8,553,466 B2 | 10/2013 | Han et al. |
| 8,559,235 B2 | 10/2013 | Yoon et al. |
| 8,654,587 B2 | 2/2014 | Yoon et al. |
| 9,595,333 B2 | 3/2017 | Sim et al. |

(Continued)

OTHER PUBLICATIONS

European Search Report dated Mar. 24, 2023 for corresponding EP Patent Application No. 22209342.9.

*Primary Examiner* — Pho M Luu
(74) *Attorney, Agent, or Firm* — Harness, Dickey & Pierce, P.L.C.

(57) ABSTRACT

A semiconductor device includes a cell area including a plurality of word lines stacked on a substrate, at least one ground select line between the plurality of word lines and substrate, and a plurality of channel structures passing through the plurality of word lines and the at least one ground select line, and a peripheral circuit area including peripheral circuits controlling the cell area. The peripheral circuits input a first ground select bias voltage to the at least one ground select line during a first program time to a program word line selected from among the plurality of word lines, and input a second ground select bias voltage having a magnitude different from the first ground select bias voltage to the at least one ground select line during a second program time, the second program voltage different from the first program voltage.

20 Claims, 26 Drawing Sheets

(56) References Cited

U.S. PATENT DOCUMENTS

| | | |
|---|---|---|
| 10,355,016 B2 * | 7/2019 | Lee .................. H10B 41/27 |
| 10,614,891 B2 | 4/2020 | Park et al. |
| 10,636,496 B2 | 4/2020 | Li et al. |
| 10,847,228 B2 | 11/2020 | Lee |
| 2001/0005330 A1 * | 6/2001 | Choi .................. G11C 16/10 |
| | | 365/185.17 |
| 2010/0027332 A1 | 2/2010 | Lee et al. |
| 2010/0080059 A1 * | 4/2010 | Chen .................. G11C 16/0483 |
| | | 365/185.12 |
| 2011/0110159 A1 | 5/2011 | Park |
| 2011/0233648 A1 | 9/2011 | Seol et al. |
| 2018/0374541 A1 | 12/2018 | Jung et al. |

* cited by examiner

SEMICONDUCTOR DEVICE

CROSS-REFERENCE TO RELATED APPLICATION(S)

This application claims the benefit under 35 USC 119(a) of Korean Patent Application No. 10-2021-0164339 filed on Nov. 25, 2021 and Korean Patent Application No. 10-2022-0014634 filed on Feb. 4, 2022 in the Korean Intellectual Property Office, the entire disclosures of which are incorporated herein by reference for all purposes.

BACKGROUND

The present inventive concepts relate to semiconductor devices.

Semiconductor devices may provide a function of writing and erasing data or reading recorded data. The semiconductor device may be divided into anon-volatile memory device and a volatile memory device, and in the non-volatile memory device, recorded data may be maintained even when power is cut off. The data storage capacity required for a semiconductor device is continuously increasing, and accordingly, the number of memory cells included in the semiconductor device is gradually increasing. Accordingly, various methods for securing the stable operation of the semiconductor device are actively proposed. is becoming

SUMMARY

Example embodiments provide semiconductor devices that may operate stably by changing the level of a bias voltage input to a ground select line, a source region and the like according to the magnitude of a programming voltage input to a programming word line, the position of a programming word line, or the like, during a programming operation.

According to example embodiments, a semiconductor device includes a cell area including a plurality of word lines stacked on a substrate, at least one ground select line between the plurality of word lines and the substrate, and a plurality of channel structures extending in a first direction, perpendicular to the substrate, and passing through the plurality of word lines and the at least one ground select line, and a peripheral circuit area including peripheral circuits configured to control the cell area, and configured to input a program voltage to at least a portion of the plurality of word lines in an order of approaching the substrate along the first direction. The peripheral circuits are configured to input a first ground select bias voltage to the at least one ground select line during a first program time for inputting a first program voltage to a program word line among the plurality of word lines, and the peripheral circuits are configured to input a second ground select bias voltage having a magnitude different from a magnitude of the first ground select bias voltage to the at least one ground select line during a second program time for inputting a second program voltage having a magnitude different from a magnitude of the first program voltage to the program word line.

According to example embodiments, a semiconductor device includes a cell area including a plurality of word lines stacked on a substrate, at least one ground select line between the plurality of word lines and the substrate, a plurality of channel structures extending in a first direction, perpendicular to the substrate, and passing through the plurality of word lines and the at least one ground select line, and a source region in the substrate and electrically connected to the plurality of channel structures, and a peripheral circuit area including peripheral circuits configured to control the cell area. The peripheral circuits are configured to perform a first program operation on a first program word line located at a first height in the first direction, the first programming operation including sequentially inputting a voltage of a first level and a voltage of a second level different from the first level to the at least one ground select line, and perform a second program operation on a second program word line located at a second height, lower than the first height, the second program operation including sequentially inputting a voltage of a third level, lower than the first level, and a voltage of a fourth level, lower than the second level, to the at least one ground select line.

According to example embodiments, a semiconductor device includes a plurality of ground select transistors connected to a common source line and a ground select line, a plurality of string select transistors connected to a plurality of bit lines and at least one string select line, a plurality of memory cells connected to each other in series between the plurality of ground select transistors and the plurality of string select transistors, and connected to a plurality of word lines, and a row decoder controlling the ground select transistors, the string select transistors, and the memory cells. The row decoder is configured to input a first program voltage for a first program time and inputs a second program voltage for a second program time after the first program time, to a program word line connected to a selected memory cell among the plurality of memory cells, and the row decoder is configured to determine absolute values of voltages respectively input to the ground select line and the common source line in the first program time and the second program time, respectively, based on respective magnitudes of the first program voltage and the second program voltage.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Hereinafter, example embodiments will be described in detail with reference to the accompanying drawings.

Figure 1:
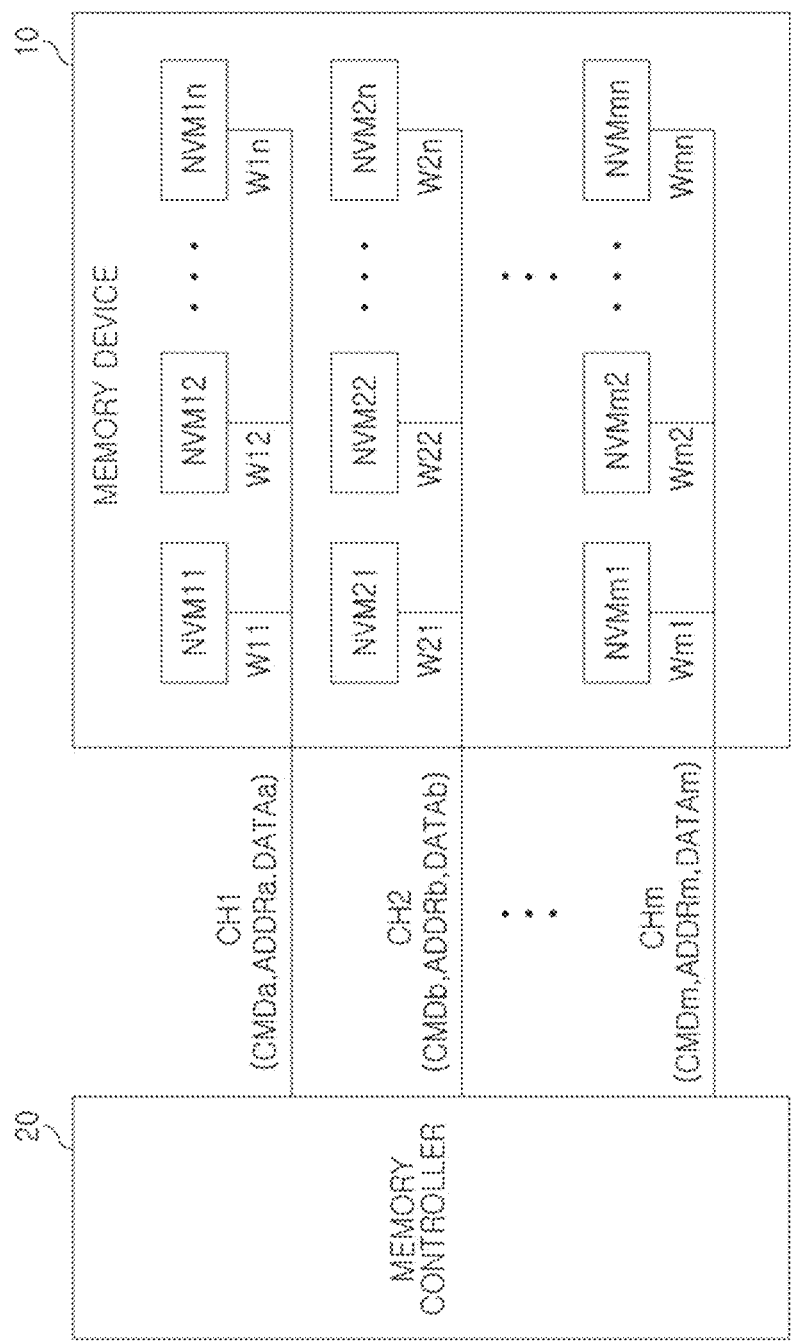
FIG. 1 is a schematic block diagram illustrating a system including a semiconductor device according to some example embodiments.

FIG. 1 is a schematic block diagram illustrating a system including a semiconductor device according to some example embodiments.

Referring to FIG. 1, a system 1 may include a semiconductor device 10 provided as a memory device, and a memory controller 20. The system 1 may support a plurality of channels CH1 to CHm, and the semiconductor device 10 and the memory controller 20 may be connected through the plurality of channels CH1 to CHm. For example, the system 1 may be implemented as a storage device such as a solid state drive (SSD).

The semiconductor device 10 may include a plurality of memory devices NVM11 to NVMmn. Each of the memory devices NVM11 to NVMmn may be connected to one of the plurality of channels CH1 to CHm through a corresponding way. For example, the memory devices NVM11 to NVM1n may be connected to a first channel CH1 through ways W11 to W1n, and the memory devices NVM21 to NVM2n may be connected to a second channel CH2 through ways W21 to W2n. In some example embodiments, each of the memory devices NVM11 to NVMmn may be implemented as an arbitrary memory unit capable of operating according to an individual command from the memory controller 20. For example, each of the memory devices NVM11 to NVMmn may be implemented as a chip or a die, but the present inventive concepts are not limited thereto.

The memory controller 20 may transmit/receive signals to and from the semiconductor device 10 through the plurality of channels CH1 to CHm. For example, the memory controller 20 may transmit commands CMDa to CMDm, addresses ADDRa to ADDRm, and data DATAa to DATAm to the semiconductor device 10 through the channels CH1 to CHm, or receive data DATAa to DATAm from the semiconductor device 10.

The memory controller 20 may select one of the nonvolatile memory devices connected to the corresponding channel, through a respective channel, and may transmit and receive signals to and from a selected nonvolatile memory device. For example, the memory controller 20 may select the nonvolatile memory device NVM11 from among the memory devices NVM11 to NVM1n connected to the first channel CH1. The memory controller 20 may transmit the command CMDa, the address ADDRa, and the data DATAa to a selected memory device NVM11 through the first channel CH1, or receive data DATAa from the selected memory device NVM11.

The memory controller 20 may transmit/receive signals to and from the semiconductor device 10 in parallel through different channels. For example, the memory controller 20 may transmit the command CMDb to the semiconductor device 10 through a second channel CH2 while transmitting the command CMDa to the semiconductor device 10 through the first channel CH1. For example, the memory controller 20 may receive data DATAb from the semiconductor device 10 through the second channel CH2, while receiving the data DATAa from the semiconductor device 10 through the first channel CH1.

The memory controller 20 may control the overall operation of the semiconductor device 10. The memory controller 20 may transmit signals to the channels CH1 to CHm to control each of the memory devices NVM11 to NVMmn connected to the channels CH1 to CHm. For example, the memory controller 20 may transmit a command CMDa and an address ADDRa to the first channel CH1 to control a selected one memory device among the memory devices NVM11 to NVM1n.

Each of the memory devices NVM11 to NVMmn may operate under the control of the memory controller 20. For example, the memory device NVM11 may program the data DATAa according to the command CMDa, the address ADDRa, and the data DATAa provided to the first channel CH1. For example, the memory device NVM21 may read the data DATAb according to the command CMDb and the address ADDRb provided to the second channel CH2, and transmit the read data DATAb to the memory controller 20.

Although FIG. 1 illustrates that the semiconductor device 10 communicates with the memory controller 20 through m channels and the semiconductor device 10 includes n non-volatile memory devices corresponding to respective channels, the number of channels and the number of nonvolatile memory devices connected to one channel may be variously changed.

Figure 2:
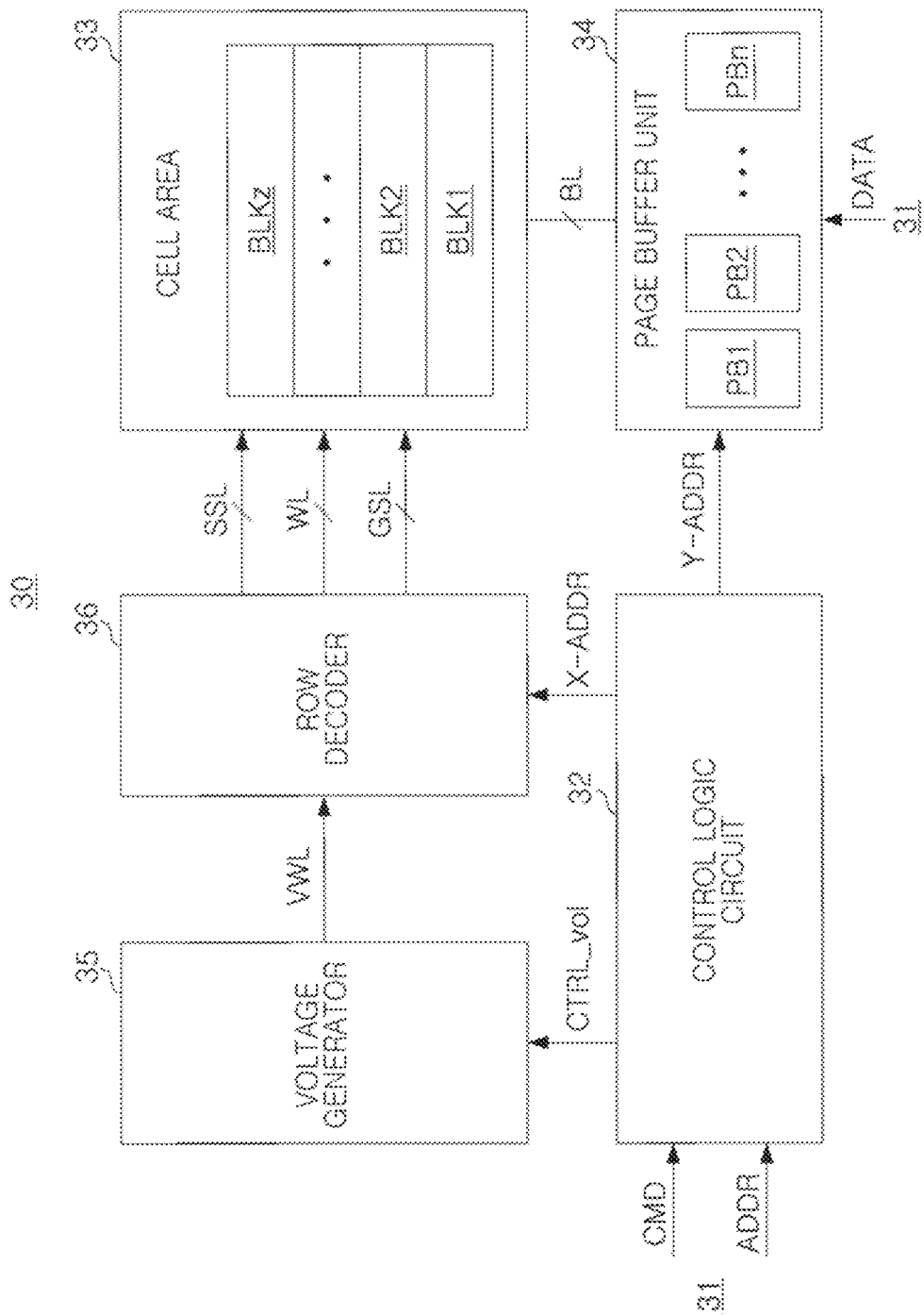
FIG. 2 is a schematic block diagram of a semiconductor device according to some example embodiments.

FIG. 2 is a schematic block diagram of a semiconductor device according to some example embodiments.

Referring to FIG. 2, a semiconductor device 30 may include a control logic circuit 32, a cell area 33, a page buffer unit 34, a voltage generator 35, and a row decoder 36. The semiconductor device 30 may further include an interface circuit 31, and may further include column logic, a pre-decoder, a temperature sensor, a command decoder, an address decoder, a source driver, and the like. The semiconductor device 30 may be a memory device that stores data, for example, a non-volatile memory device that retains stored data even when power thereto is cut off.

The control logic circuit 32 may generally control various operations in the semiconductor device 30. The control logic circuit 32 may output various control signals in response to the command CMD and/or the address ADDR received by the interface circuit 31. For example, the control logic circuit 32 may output a voltage control signal CTRL_vol, a row address X-ADDR, and a column address Y-ADDR.

The cell area 33 may include a plurality of memory blocks BLK1-BLKz (Z is a positive integer), and each of the plurality of memory blocks BLK1-BLKz may include a plurality of memory cells. In some example embodiments, the plurality of memory blocks BLK1-BLKz may be separated from each other by first separation regions including an insulating material, and second separation regions different from the first separation regions may be disposed in the plurality of respective memory blocks BLK1-BLKz. For example, each of the second separation regions may have a structure different from that of the first separation regions.

For example, the plurality of memory blocks BLK1-BLKz may include main blocks storing data and at least one spare block storing data required for the operation of the semiconductor device 30. The cell area 33 may be connected to the page buffer unit 34 through bit lines BL, and may be connected to the row decoder 36 through word lines WL, string select lines SSL, and ground select lines GSL.

In some example embodiments, the cell area 33 may include a three-dimensional memory cell array, and the 3D memory cell array may include a plurality of NAND strings.

Each NAND string may include memory cells respectively connected to word lines stacked vertically on the substrate. U.S. Pat. Nos. 7,679,133, 8,553,466, 8,654,587, 8,559,235, and U.S. Patent Application Publication No. 2011/0233648 are incorporated herein by reference. In some example embodiments, the cell area 33 may include a two-dimensional memory cell array, and the two-dimensional memory cell array may include a plurality of NAND strings disposed in row and column directions.

The page buffer unit 34 may include a plurality of page buffer units PB1-PBn (n is an integer greater than or equal to 3), and the plurality of page buffer units PB1-PBn may be respectively connected to memory cells through a plurality of bit lines BL. The page buffer unit 34 may select at least one bit line among the bit lines BL in response to the column address Y-ADDR. The page buffer unit 34 may operate as a write driver or a sense amplifier according to an operation mode. For example, during a program operation, the page buffer unit 34 may apply a bit line voltage corresponding to data to be programmed, to the selected bit line. During a read operation, the page buffer unit 34 may sense data stored in the memory cell by sensing the current or voltage of the selected bit line. Data to be programmed into the cell area 33 through a program operation and data read from the cell area 33 through a read operation may be input/output through the interface circuit 31.

The voltage generator 35 may generate various types of voltages for performing program, read, and erase operations based on the voltage control signal CTRL_vol. For example, the voltage generator 35 may generate a program voltage, a read voltage, a pass voltage, a program verify voltage, an erase voltage, and the like. In some example embodiments, the control logic circuit 32 may control the voltage generator 35 to generate a voltage for executing program, read, and erase operations using data stored in the spare block. Portions of the voltages generated by the voltage generator 35 may be input to the word lines WL as a word line voltage VWL by the row decoder 36, and portions thereof may be input to a common source line by a source driver.

The row decoder 36 may select one of the plurality of string select lines SSL and select one of the plurality of word lines WL in response to the row address X-ADDR. For example, during a program operation, the row decoder 36 applies a program voltage and a program verify voltage to the selected word line, and during a read operation, may apply a read voltage to the selected word line.

Figure 3:
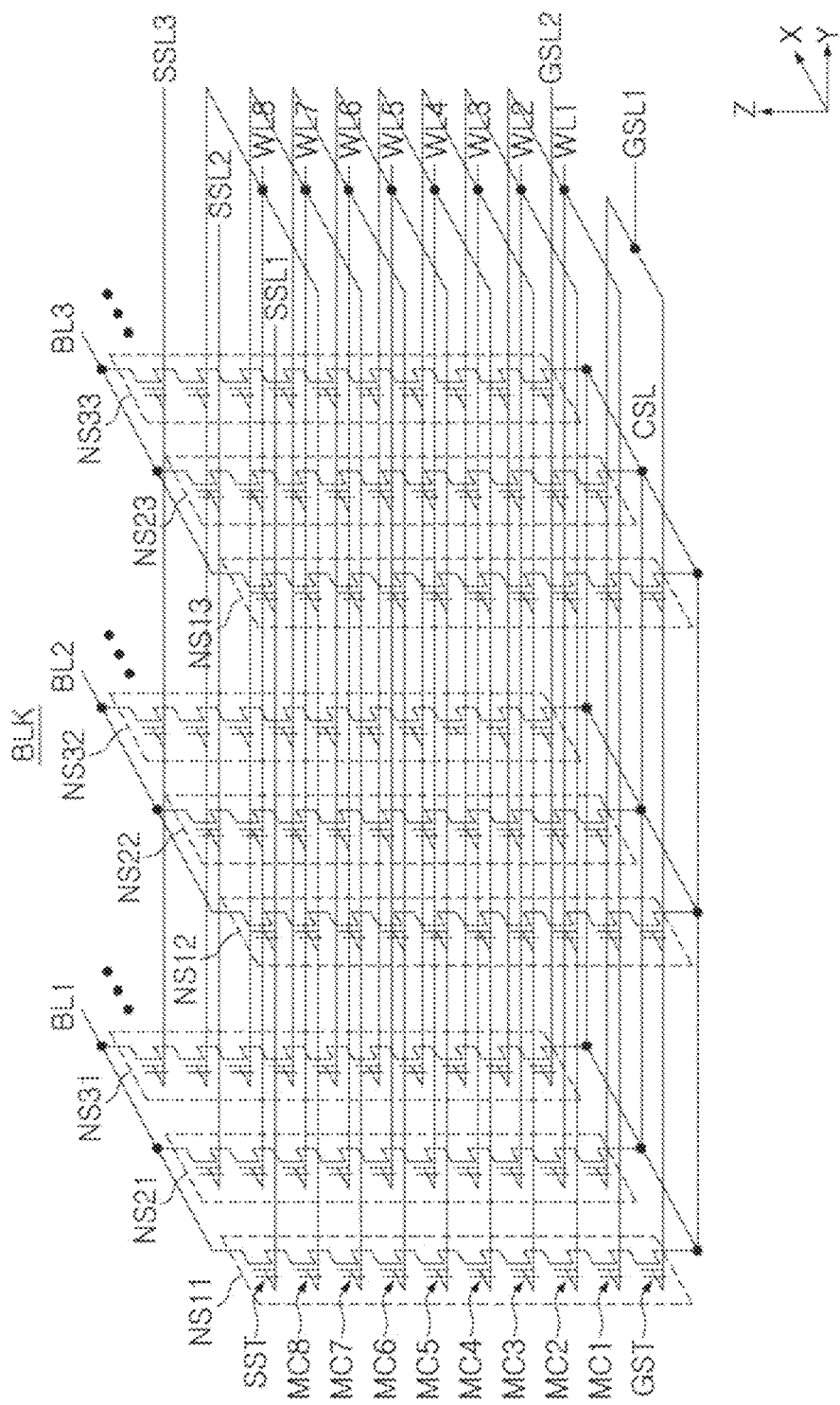
FIG. 3 is a schematic circuit diagram illustrating a semiconductor device according to some example embodiments.

FIG. 3 is a schematic circuit diagram illustrating a semiconductor device according to some example embodiments.

The memory block BLK illustrated in FIG. 3 represents a three-dimensional memory block formed on a substrate in a three-dimensional structure. For example, the plurality of NAND strings included in the memory block BLK may be formed in a direction perpendicular to the substrate.

Referring to FIG. 3, the memory block BLK may include a plurality of NAND strings NS11-NS43 connected between the bit lines BL1-BL3 and the common source line CSL. Each of the plurality of NAND strings NS11-NS43 may include a string select transistor SST, a plurality of memory cells MC1-MC8, and a ground select transistor GST. Although it is illustrated in FIG. 3 that each of the plurality of memory NAND strings NS11-NS43 includes eight memory cells MC1-MC8, the present inventive concepts are not limited thereto.

The string select transistor SST may be connected to the corresponding string select lines SSL1-SSL4. The plurality of memory cells MC1-MC8 may be respectively connected to corresponding word lines WL1-WL8. In some example embodiments, at least one of the word lines WL1-WL8 may be provided as a dummy word line. The ground select transistor GST may be connected to the corresponding ground select lines GSL1-GSL2. The string select transistor SST may be connected to the corresponding bit lines BL1-BL3, and the ground select transistor GST may be connected to the common source line CSL.

Word lines (e.g., WL1) having the same height may be connected in common, and at least portions of the ground select lines GSL1-GSL2 and the string select lines SSL1-SSL4 may be separated from each other. For example, referring to FIG. 3, the string select lines SSL1-SSL4 disposed at the same height may be separated from each other, and portions of the ground select lines GSL1-GSL2 disposed at the same height may be connected to each other. Accordingly, in the example embodiments illustrated in FIG. 3, two of the string select lines SSL1-SSL4 may be disposed above the ground select lines GSL1-GSL2 respectively. FIG. 3 illustrates that the memory block BLK is connected to eight word lines WL1-WL8 and three bit lines BL1-BL3, but the present inventive concepts are not limited thereto.

FIGS. 4A to 4D are diagrams provided to illustrate an operation of a semiconductor device according to some example embodiments.

FIGS. 4A to 4D may be diagrams illustrating threshold voltage distribution of memory cells according to the number of bits of data stored in each of the memory cells included in the memory device. First, FIG. 4A may be a diagram illustrating threshold voltage distribution of memory cells in which 1-bit data is stored.

Figure 4A:
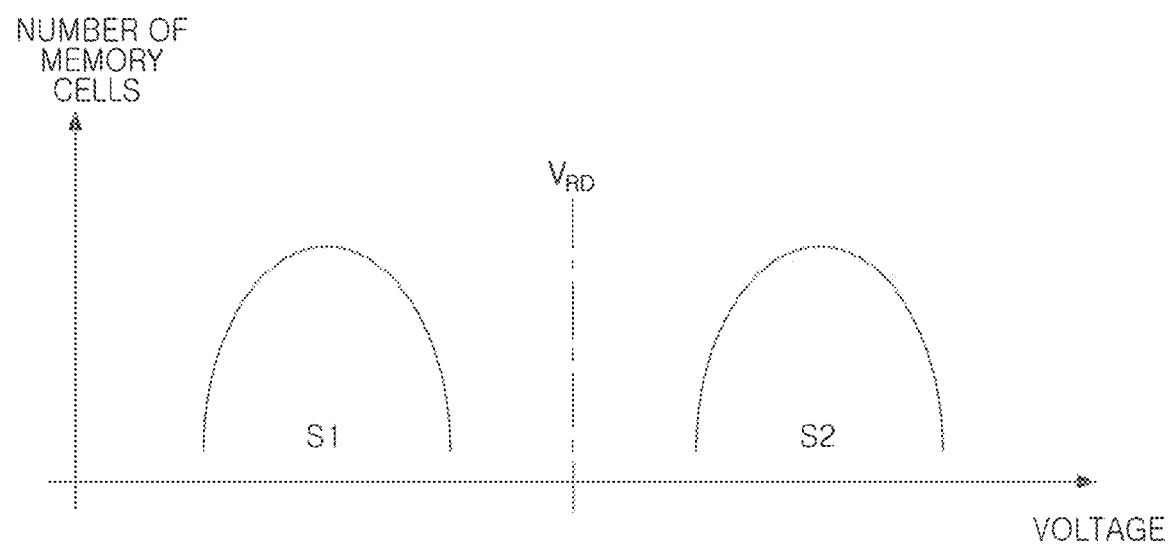
FIGS. 4A to 4D are diagrams provided to illustrate an operation of a semiconductor device according to some example embodiments.

Referring to FIG. 4A, the memory cells may have one of a first state S1 and a second state S2. The first state S1 may have a lower voltage than the second state S2. In some example embodiments illustrated in FIG. 6, the read voltage $V_{RD}$ input to the word lines by the memory controller for a read operation may be a voltage between the first state S1 and the second state S2.

Figure 4B:
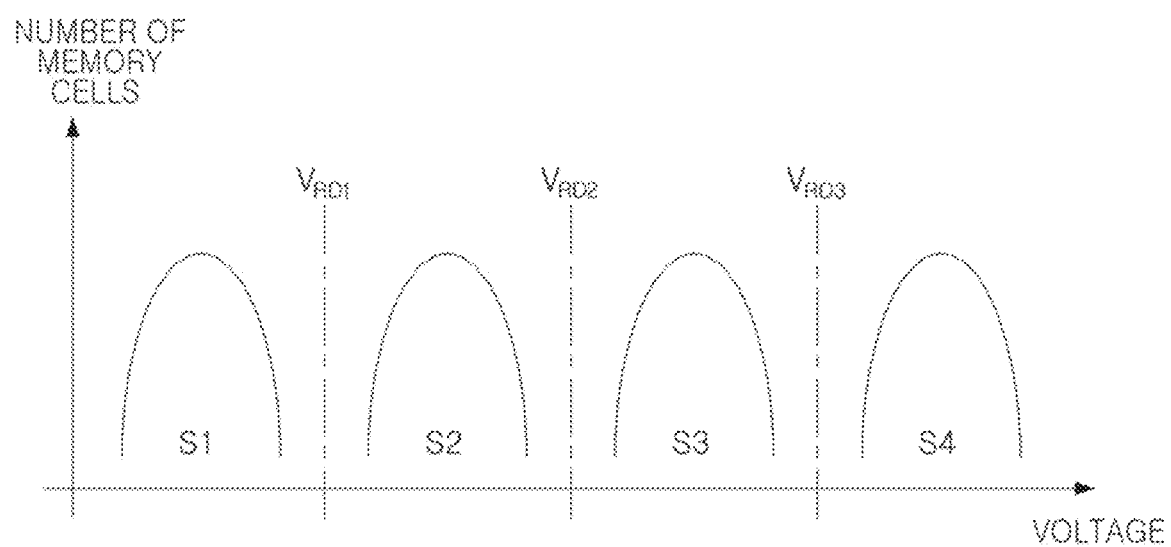

FIG. 4B may be a diagram illustrating a threshold voltage distribution of memory cells in which 2-bit data may be stored respectively. In the example embodiments illustrated in FIG. 4B, the memory cells may have any one of the first to fourth states S1 to S4. The memory controller may input the first to third read voltages $V_{RD1}$ to $V_{RD3}$ between the first to fourth states S1 to S4 to the word lines, and execute a read operation. In addition, 2-bit data may be stored in each of the memory cells through a plurality of program operations.

Figure 4C:
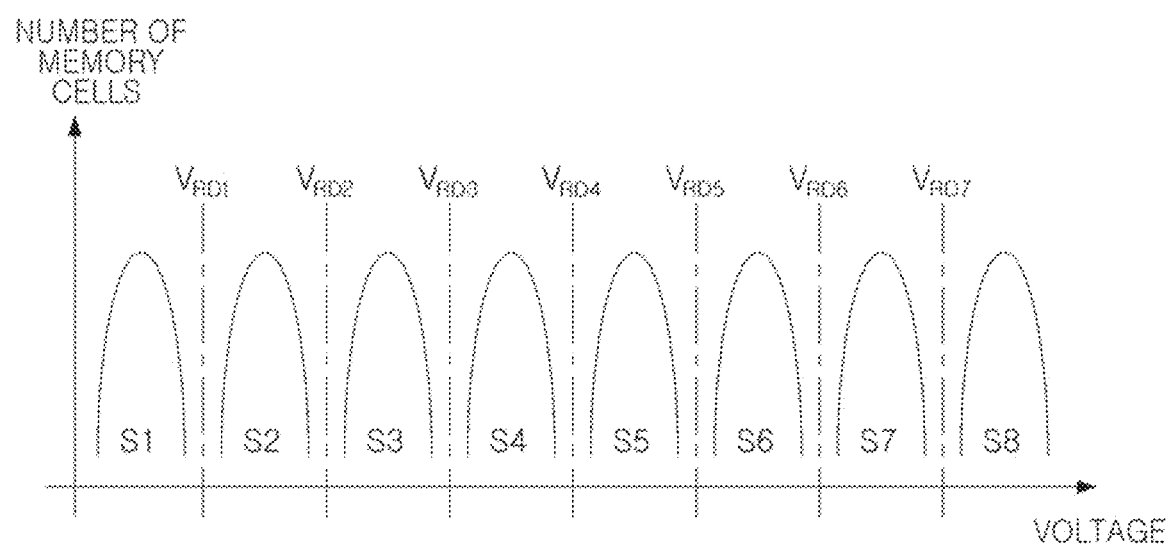

FIG. 4C may be a diagram illustrating a threshold voltage distribution of memory cells in which data of 3 bits may be stored respectively. In the example embodiments illustrated in FIG. 4C, the memory cells may have any one of first to eighth states S1 to S8. The memory controller may execute a read operation by inputting the first to seventh read voltages $V_{RD1}$ to $V_{RD7}$ between the first to eighth states S1 to S8 to the word lines.

Figure 4D:
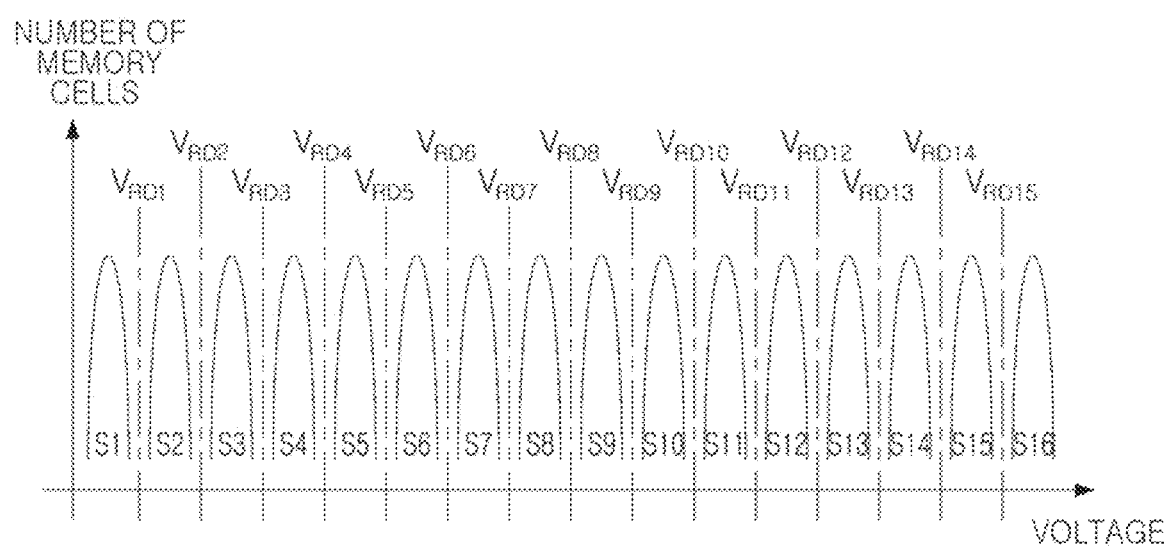

FIG. 4D may be a diagram illustrating a threshold voltage distribution of memory cells capable of storing 4-bit data respectively. In the example embodiments illustrated in FIG. 4D, the memory cells may have any one of first to sixteenth states S1 to S16. The memory controller may execute a read operation by inputting the first to fifteenth read voltages $V_{RD1}$ to $V_{RD15}$ between the first to sixteenth states S1 to S16 to the word lines.

As described with reference to FIGS. 4A to 4D, in the semiconductor device according to some example embodiments, data may be programmed or erased by changing the threshold voltages of memory cells. When the threshold voltage of each of the memory cells maintains the voltage immediately after the program operation as it is, the semiconductor device may accurately read data of each of the memory cells.

However, as described above with reference to FIG. 3, in the semiconductor device according to some example embodiments, some memory cells may be connected to the same word line and/or bit line, and accordingly, a predetermined (or, alternatively, desired) voltage is inevitably applied to unselected memory cells that are not selected in the program operation. In a case in which the threshold voltage of the unselected memory cells is changed during a program operation on the selected memory cell, data of the unselected memory cells may be damaged, which may lead to deterioration of performance and reliability of the semiconductor device.

In some example embodiments of the present inventive concepts, in a program operation, depending on the magnitude of the program voltage input to the program word line connected to the selected memory cell and the location of the program word line, a voltage input to a string select line, a ground select line, and a common source line connected to a NAND string including a select memory cell may be adjusted. Accordingly, a threshold voltage change that may occur in unselected memory cells during a program operation may be significantly reduced, and the performance and reliability of the semiconductor device may be improved.

Figure 5:
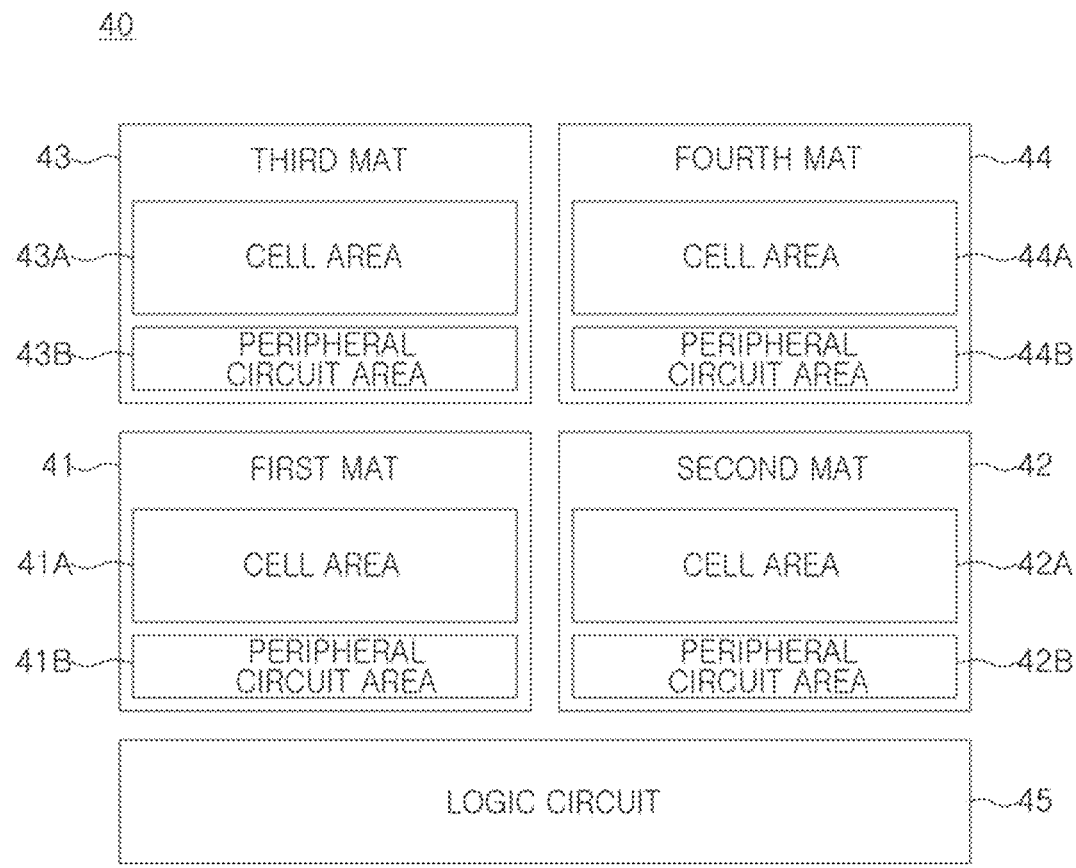
FIGS. 5 and 6 are diagrams schematically illustrating a semiconductor device according to some example embodiments.
Figure 6:
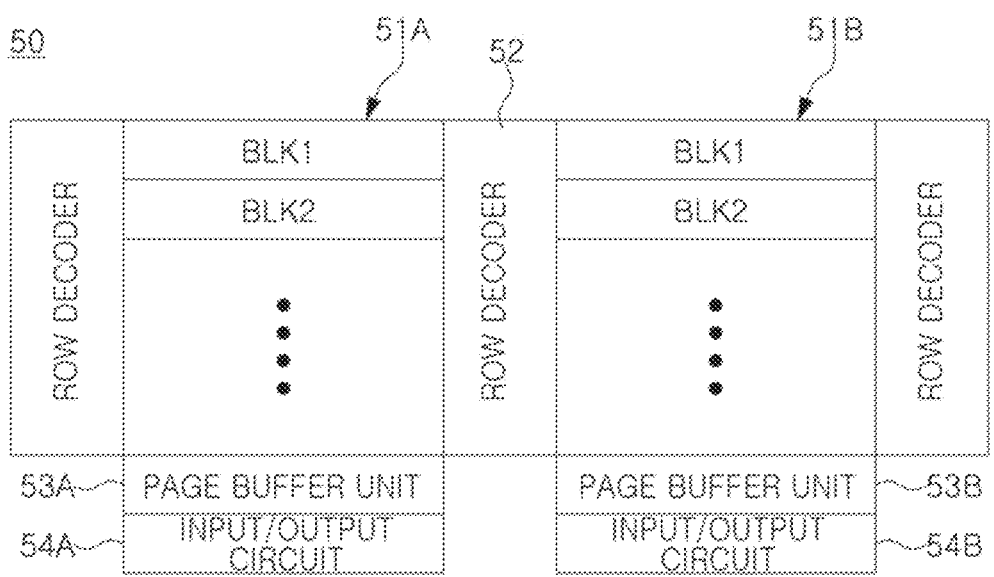

FIGS. 5 and 6 are diagrams schematically illustrating a semiconductor device according to some example embodiments.

Referring first to FIG. 5, a semiconductor device 40 according to some example embodiments may include a plurality of mats 41 to 44 and a logic circuit 45. As an example, each of the plurality of mats 41-44 may include the cell area 33, the page buffer unit 34, the row decoder 36, and the like described with reference to FIG. 2. The logic circuit 45 may include a control logic circuit 32, a voltage generator 35, and the like.

According to example embodiments, each of the plurality of mats 41 to 44 may operate independently of each other. For example, while (e.g., at the same time) the first mat 41 executes a program operation for writing data received from an external memory controller, the logic circuit 45 may read data stored in the second mat 42 and output the read data externally.

Next, FIG. 6 may be a diagram illustrating the arrangement of a cell area and a peripheral circuit area in one of mats included in a semiconductor device 50 according to some example embodiments. Referring to FIG. 6, a peripheral circuit area is disposed around the cell areas 51A and 51B, and for example, the row decoder 52 may be disposed on both sides of each of the cell areas 51A and 51B. On the other hand, the page buffer units 53A and 53B may be respectively disposed on one side of the cell areas 51A and 51B. A direction in which each of the cell areas 51A and 51B is adjacent to the row decoder 52 may intersect a direction in which each of the cell areas 51A and 51B is adjacent to the page buffer units 53A and 53B. The row decoder 52 and the page buffer units 53A and 53B may be connected to a logic circuit controlling the overall operation of the semiconductor device 50 and an input/output interface communicating with an external device, through the input/output circuits 54A and 54B.

For example, word lines, string select lines, and ground select lines included in each of the cell areas 51A and 51B may extend in the horizontal direction of FIG. 6, and may be connected to the row decoder 52 adjacent to the cell areas 51A and 51B. On the other hand, in each of the cell areas 51A and 51B, bit lines connected to the channel layers may extend in the vertical direction to be connected to the page buffer units 53A and 53B disposed on one side of each of the cell areas 51A and 51B. In the example embodiments illustrated in FIG. 6, the cell areas 51A and 51B, the row decoder 52, the page buffer units 53A and 53B, the input/output circuits 54A and 54B, and the like may be formed on one substrate.

Figure 7:
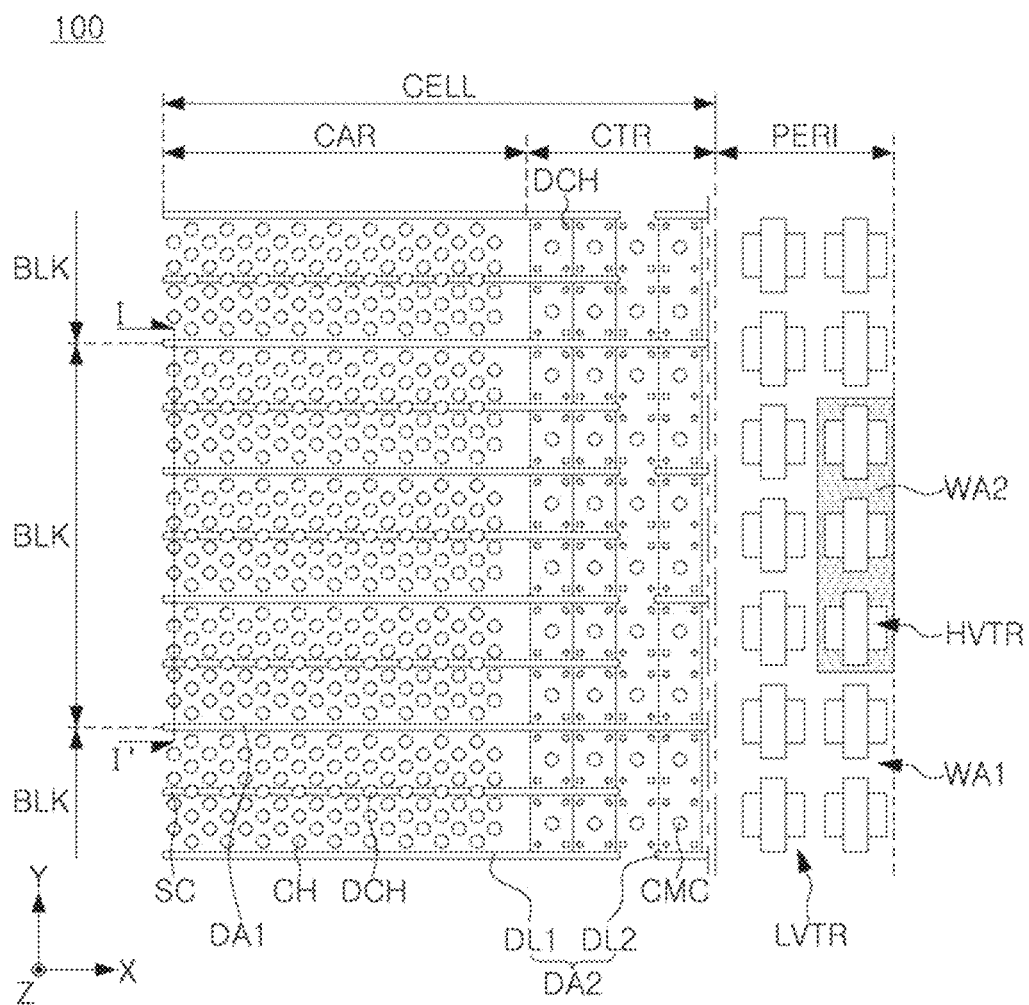
FIGS. 7 to 9 are diagrams schematically illustrating a semiconductor device according to some example embodiments.
Figure 8:
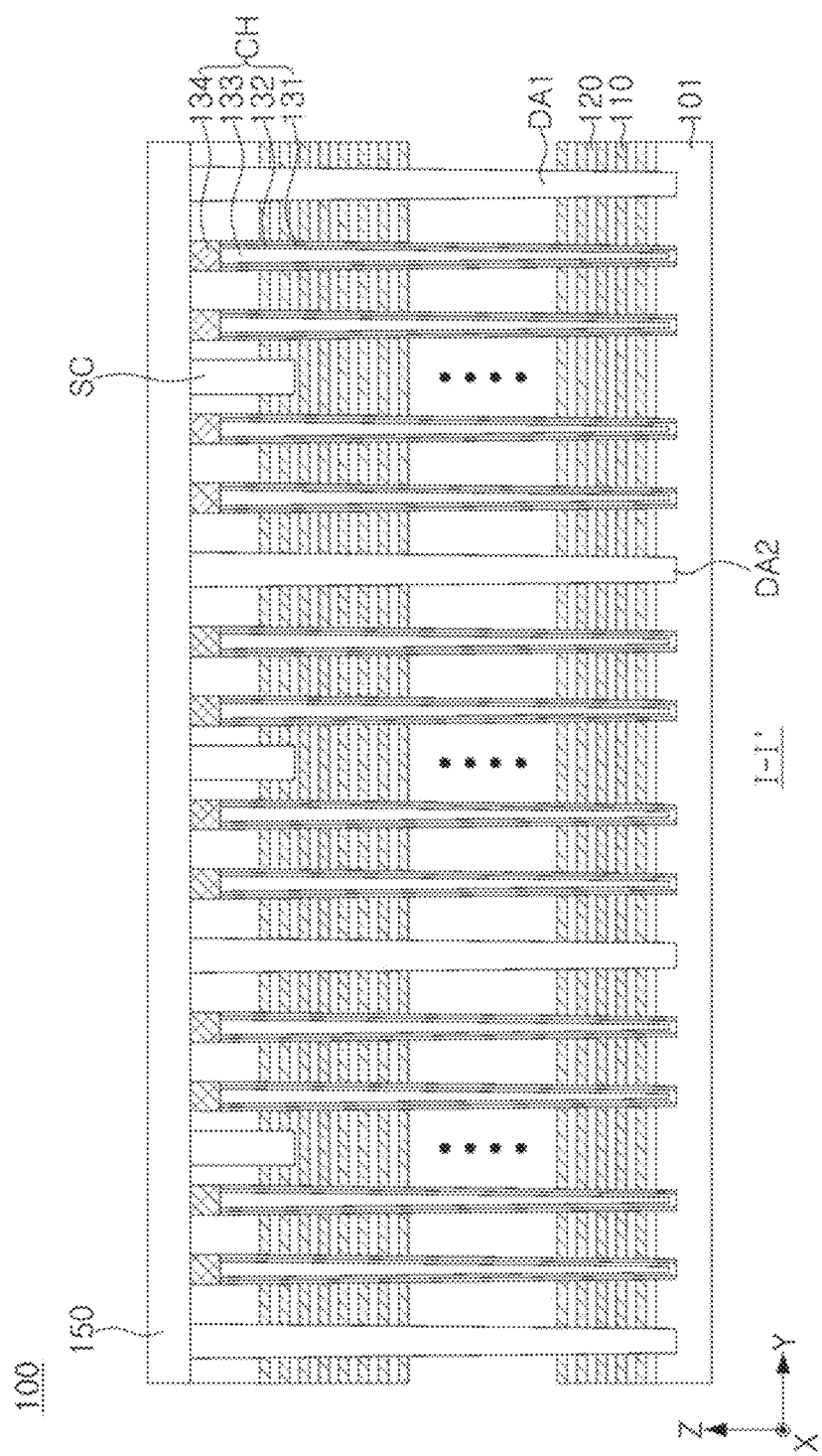
Figure 9:
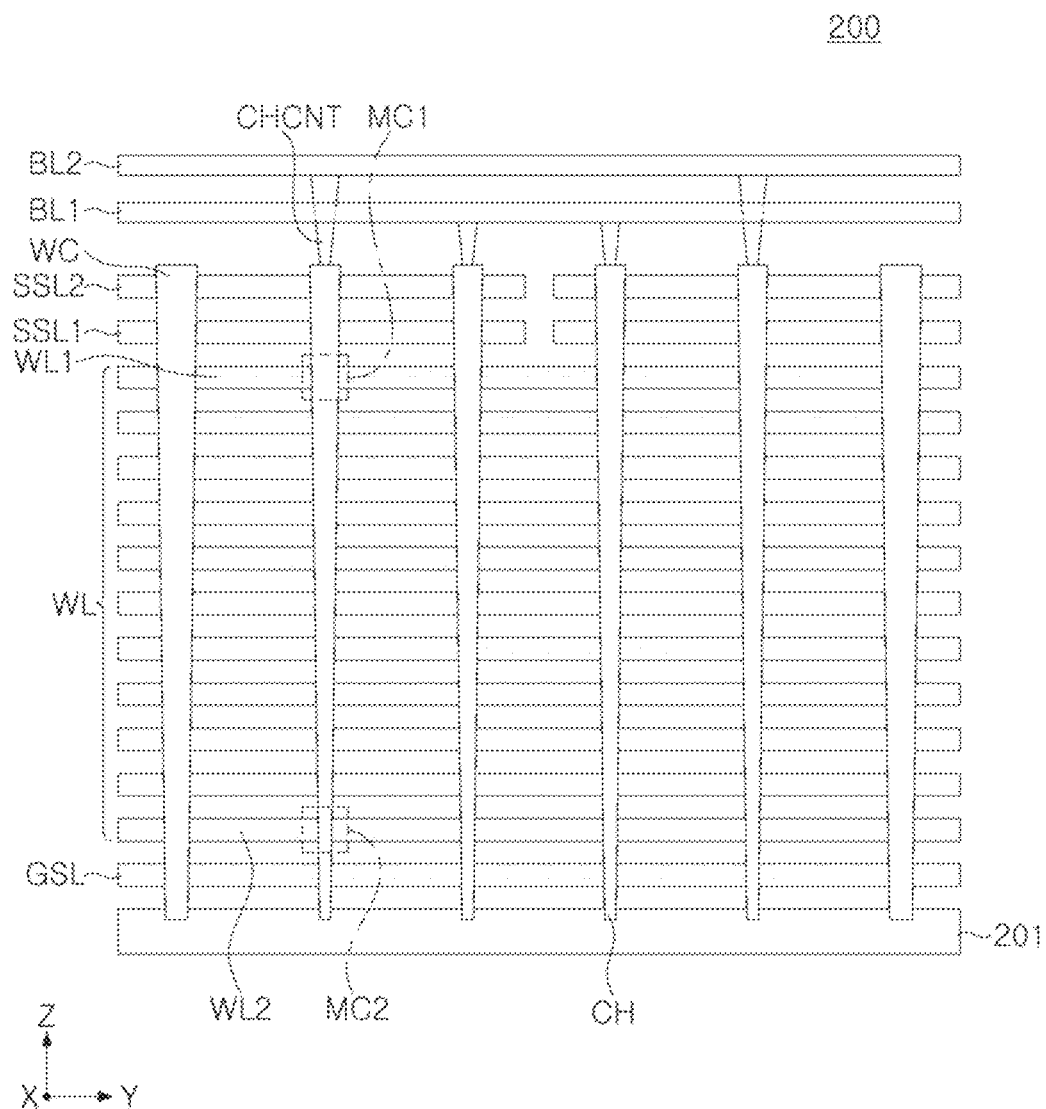

FIGS. 7 to 9 are diagrams schematically illustrating a semiconductor device according to some example embodiments.

FIG. 7 may be a plan view illustrating a portion of a semiconductor device 100 according to some example embodiments. Referring to FIG. 7, the semiconductor device 100 may include a cell area CELL and a peripheral circuit area PERI, and the cell area CELL may include a cell array region CAR and a cell contact region CTR. For example, the cell array region CAR may be a region in which the channel structures CH are disposed, and the cell contact region CTR may be a region in which the cell contacts CMC are disposed. In the example embodiments illustrated in FIG. 7, the cell contact region CTR may be disposed between the cell array area CAR and the peripheral circuit area PERI.

In the cell area CELL, a plurality of gate electrode layers stacked in a first direction (Z-axis direction), and a plurality of channel structures CH extending in the first direction and penetrating the plurality of gate electrode layers may be disposed. The plurality of gate electrode layers are formed of a conductive material such as metal or metal silicide, and each of the plurality of channel structures CH may include a channel layer, a charge storage layer, a tunneling layer, and the like.

A plurality of devices LVTR and HVTR may be disposed in the peripheral circuit area PERI, and the plurality of devices LVTR and HVTR may be formed in a first well region WA1 and a second well region WA2 having different impurity characteristics. For example, low voltage devices LVTR may be formed in the first well region WA1, and high voltage devices HVTR may be formed in the second well region WA2. In some example embodiments illustrated in FIG. 7, at least portions of the devices LVTR and HVTR adjacent to the cell area CELL in the second direction (X-axis direction) may be devices included in a row decoder connected to the cell contacts CMC of the cell contact region CTR.

As illustrated in FIG. 7, the cell area CELL includes a plurality of blocks BLK, and the plurality of blocks BLK may be separated from each other by a plurality of first separation regions DA1 extending in the second direction, and may be arranged in a third direction (Y-axis direction). Each of the plurality of first separation regions DA1 may extend in the second direction to traverse the cell area CELL, and may include an insulating material. For example, each of the plurality of first separation regions DA1 may be formed of silicon oxide, silicon nitride, or the like.

On the other hand, at least one of the plurality of second separation regions DA2 may be disposed in each of the plurality of blocks BLK. The plurality of second separation regions DA2 may extend in the second direction, like the plurality of first separation regions DA1, but may be disposed inside one of the plurality of blocks BLK rather than a boundary between the plurality of blocks BLK. In the example embodiments illustrated in FIG. 5, each of the plurality of blocks BLK is illustrated as including two second separation regions DA2, but the number of second separation regions DA2 included in each of the plurality of blocks BLK may vary depending on example embodiments.

Referring to FIG. 7, each of the plurality of second separation regions DA2 disposed inside each of the plurality of blocks BLK may be divided into a first line DL1 and a second line DL2 in a second direction (X-axis direction). The first line DL1 and the second line DL2 may be separated from each other without being connected to each other in the second direction. Accordingly, portions of the plurality of gate electrode layers may be connected as one layer in each of the plurality of blocks BLK through the first line DL1 and the second line DL2.

For example, among the plurality of gate electrode layers, gate electrode layers providing a plurality of word lines may be connected to each other between the first line DL1 and the second line DL2. For example, the gate electrode layers disposed at the first height and providing one of the word lines may be connected to each other between the first line DL1 and the second line DL2, and may not be divided into a plurality of regions in the third direction (Y-axis direction) in each of the plurality of blocks BLK.

On the other hand, the gate electrode layers providing the string select line may be divided into a plurality of regions in the third direction by the first line DL1 and an upper separation layer SC in each of the plurality of blocks BLK. On the other hand, portions of the gate electrode layers providing the ground select line may be connected to each other in each of the plurality of blocks BLK. In some example embodiments, below a pair of gate electrode layers separated from each other by the upper separation layer SC to provide a pair of string select lines, a pair of gate electrode layers providing a ground select line may be connected to each other. In this case, the number of string select lines disposed in one block BLK may be greater than the number of ground select lines.

FIG. 8 is a view illustrating a cross section in the direction I-I' of FIG. 7. Referring to FIGS. 7 and 8 together, the semiconductor device 100 may include a plurality of gate electrode layers 110 and a plurality of insulating layers 120 stacked in a first direction (Z-axis direction) perpendicular to the upper surface of the substrate 101, channel structures CH extending in the first direction and penetrating the gate electrode layers 110 and the insulating layers 120, and the like. Each of the channel structures CH may include a channel layer 132 connected to the substrate 101, a gate dielectric layer 131 disposed between the channel layer 132 and the gate electrode layers 110, a buried insulating layer 133 inside the channel layer 132, a drain region 134 on the channel layer 132, and the like. An interlayer insulating layer 150 may be disposed on the plurality of gate electrode layers 110.

The gate dielectric layer 131 may include a tunneling layer, a charge storage layer, a blocking layer, and the like. For example, at least one of the tunneling layer, the charge storage layer, and the blocking layer may be formed to surround the gate electrode layers 110. The drain region 134 may be connected to at least one of the bit lines BL through the bit line contact 135, and the bit lines BL may be connected to a page buffer formed in the peripheral circuit area PERI. The bit lines BL may extend in a third direction (Y-axis direction).

FIG. 9 may be a schematic diagram illustrating a semiconductor device 200 according to some example embodiments. Referring to FIG. 9, the semiconductor device 200 may include a plurality of word lines WL stacked on a substrate 201, a plurality of string select lines SSL1 and SSL2 disposed on the plurality of word lines WL, a ground select line GSL disposed between the plurality of word lines WL and the substrate 201, and the like. FIG. 9 illustrates that the first string select line SSL1 and the second string select line SSL2 are stacked in the first direction (Z-axis direction), and the number of the plurality of string select lines SSL1 and SSL2 may vary depending on example embodiments.

The plurality of channel structures CH extends in the first direction to pass through the plurality of word lines WL, the plurality of string select lines SSL1 and SSL2, and the ground select line GSL to be connected to the substrate 201, and may be connected to the bit lines BL1 and BL2 through upper channel contacts CHCNT. The plurality of word lines WL, the plurality of string select lines SSL1 and SSL2, and the ground select line GSL may be separated from each other in a third direction (Y-axis direction) by the separation region DA extending in the second direction (X-axis direction).

The plurality of word lines WL may provide memory cells together with the plurality of channel structures CH. The number of memory cells may be determined according to the number of the plurality of word lines WL and the number of the plurality of channel structures CH.

In some example embodiments, the program operation for writing data to the plurality of memory cells may be performed in a direction from a word line disposed on the upper part to a word line disposed on the lower part in the first direction among the plurality of word lines WL. As an example, in the example embodiments illustrated in FIG. 9, a program operation on the first memory cell MC1 connected to the first word line WL1 may be performed first, and a program operation on the second memory cell MC2 connected to the second word line WL2 may be executed last. Accordingly, the program voltage may be input to the first word line W1L first, and the program voltage may be input to the second word line WL2 last.

As illustrated in FIG. 9, since the program voltage is input to each of the plurality of word lines WL as a unit, while the program voltage is input to the first word line WL1, the program voltage may also be applied to other memory cells connected to the first word line WL1, rather than the first memory cell MC1. Accordingly, data of memory cells other than the first memory cell MC1 may be unintentionally changed. For example, unlike the first memory cell MC1, data of the memory cells provided by the channel structures CH connected to the first bit line BL1 and connected to the first word line WL1 may be unintentionally changed.

According to some example embodiments of the present inventive concepts, the above problem may be prevented or reduced by boosting the voltage of the channel layer in the unselected memory cells. When the voltage of the channel layer of the memory cells not selected in the program operation is boosted, a difference between the program voltage input through the word line and the voltage of the channel layer may be reduced. Accordingly, a phenomenon in which unselected memory cells are unintentionally programmed may be significantly reduced.

For example, the semiconductor device 200 may perform a channel initialization operation or the like before applying a program voltage to a program word line selected from among the plurality of word lines WL to perform a program. In some example embodiments, while the channel initialization operation is executed, the magnitude of the voltage input to the ground select line GSL and/or the common source line formed on the substrate 201 and connected to the channel structures CH may vary according to the magnitude of the program voltage and/or the position of the program word line, or the like, thereby boosting the voltage of the channel layer of the unselected memory cells as required. For example, the position of the program word line may be a position of the program word line in the first direction among the plurality of word lines WL.

Figure 10:
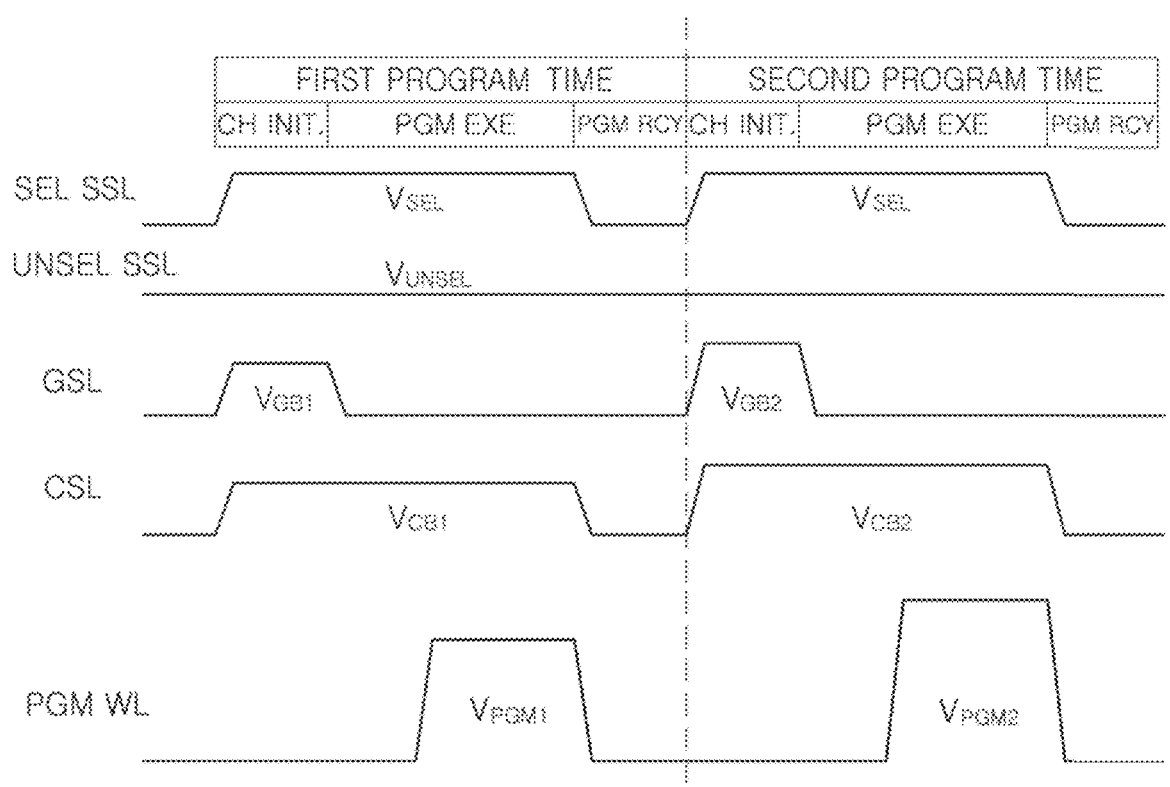
FIG. 10 is a diagram provided to illustrate an operation of a semiconductor device according to some example embodiments.

FIG. 10 is a diagram provided to illustrate an operation of a semiconductor device according to some example embodiments.

Referring to FIG. 10, the peripheral circuit area of the semiconductor device according to some example embodiments may select one program word line PGM WL from among a plurality of word lines to input a program voltage. As illustrated in FIG. 10, the peripheral circuit area may input the program voltage to the program word line PGM WL twice or more during the program operation. For example, the row decoder of the peripheral circuit area may input the first program voltage $V_{PGM1}$ to the program word line PGM WL during the first program time, and input the second program voltage $V_{PGM2}$ to the program word line PGM WL during the second program time. The first program voltage $V_{PGM1}$ and the second program voltage $V_{PGM2}$ may have different magnitudes, and in some example embodiments illustrated in FIG. 10, the first program voltage $V_{PGM1}$ may be lower than the second program voltage $V_{PGM2}$.

Each of the first program time and the second program time may include a channel initialization time, a program execution time, a program recovery time, and the like. During the channel initialization time, the semiconductor device may control the row decoder to set the voltage of the channel layer. The program execution time may be a time when a program voltage is input to the program word line PGM WL, and the program recovery time may be a time during which the program voltage is discharged.

First, during the channel initialization time of the first program time, the peripheral circuit area may input a selection voltage $V_{SEL}$ to the string select line SEL SSL connected to the same NAND string as the selection memory cell. On the other hand, an unselected voltage $V_{UNSEL}$ may be input to a string select line UNSEL SSL connected to a NAND string different from the selected memory cell. For example, the selection voltage $V_{SEL}$ may be a voltage greater than a threshold voltage of a string select transistor connected to the string select line, and the unselected voltage $V_{UNSEL}$ may be a voltage lower than a threshold voltage of a string select transistor connected to the string select line.

On the other hand, in the peripheral circuit area, a first ground select bias voltage $V_{GB1}$ may be input to the ground select line GSL and a first source bias voltage $V_{CB1}$ may be input to the common source line CSL. The common source line CSL is electrically connected to a source region formed on a substrate in the cell area of the semiconductor device, and thus, NAND strings of a block in which the selected memory cell is disposed may be commonly connected to one common source line CSL.

When the channel initialization time elapses, the first ground select bias voltage $V_{GB1}$ is discharged, and the levels of the first source bias voltage $V_{CB1}$, the selection voltage $V_{SEL}$, and the non-selection voltage $V_{UNSEL}$ may be maintained as they are. The first program voltage $V_{PGM1}$ may be input to the program word line PGM WL connected to the selected memory cell during the program execution time. The first ground select bias voltage $V_{GB1}$ may be first discharged before the first program voltage $V_{PGM1}$ is input. On the other hand, the first source bias voltage $V_{CB1}$ input to the source region through the common source line CSL may be maintained while the first program voltage $V_{PGM1}$ is input.

Charges may be trapped in the charge storage layer of the selected memory cell by a difference between the first program voltage $V_{PGM1}$ input to the program word line PGM WL and the channel voltage of the NAND string including the selected memory cell. During the program execution time, a pass voltage lower than the first program voltage $V_{PGM1}$ may be input to word lines other than the program word line PGM WL.

During the first program time, a ground voltage may be input to the bit line connected to the selected NAND string including the selected memory cell, and a voltage greater than the ground voltage may be input to the bit lines connected to the unselected NAND string including the selected memory cell. Accordingly, the voltage of the channel layer of the unselected NAND string may be relatively higher than the voltage of the channel layer of the selected NAND string, and data of memory cells included in the unselected NAND string may be prevented or reduced from being unintentionally changed. For example, data change of an unselected memory cell connected to the program word line PGM WL in the unselected NAND string may be prevented or reduced.

However, in the second program operation in which the second program voltage $V_{PGM2}$ relatively greater than the first program voltage $V_{PGM1}$ is input, a probability that data of an unselected memory cell connected to the program word line PGM WL is changed may increase in the unselected NAND string. In some example embodiments, the level of the second ground select bias voltage $V_{GB2}$ input to the ground select line GSL in the second program operation may be greater than the level of the first ground select bias voltage $V_{GB1}$. Also, in the second program operation, the level of a second source bias voltage $V_{CB2}$ input to the common source line CSL may be greater than the level of the first source bias voltage $V_{CB1}$. In detail, the absolute values of the voltages input to the ground select line GSL and the common source line CSL may vary according to the magnitude of the program voltage input to the program word line PGM WL. Accordingly, the voltage of the channel layer of the unselected NAND string may have a relatively higher level in the second program operation than in the first program operation, and the data of the unselected memory cells may be effectively prevented (or reduced) from being unintentionally changed in the second program operation.

Figure 11:
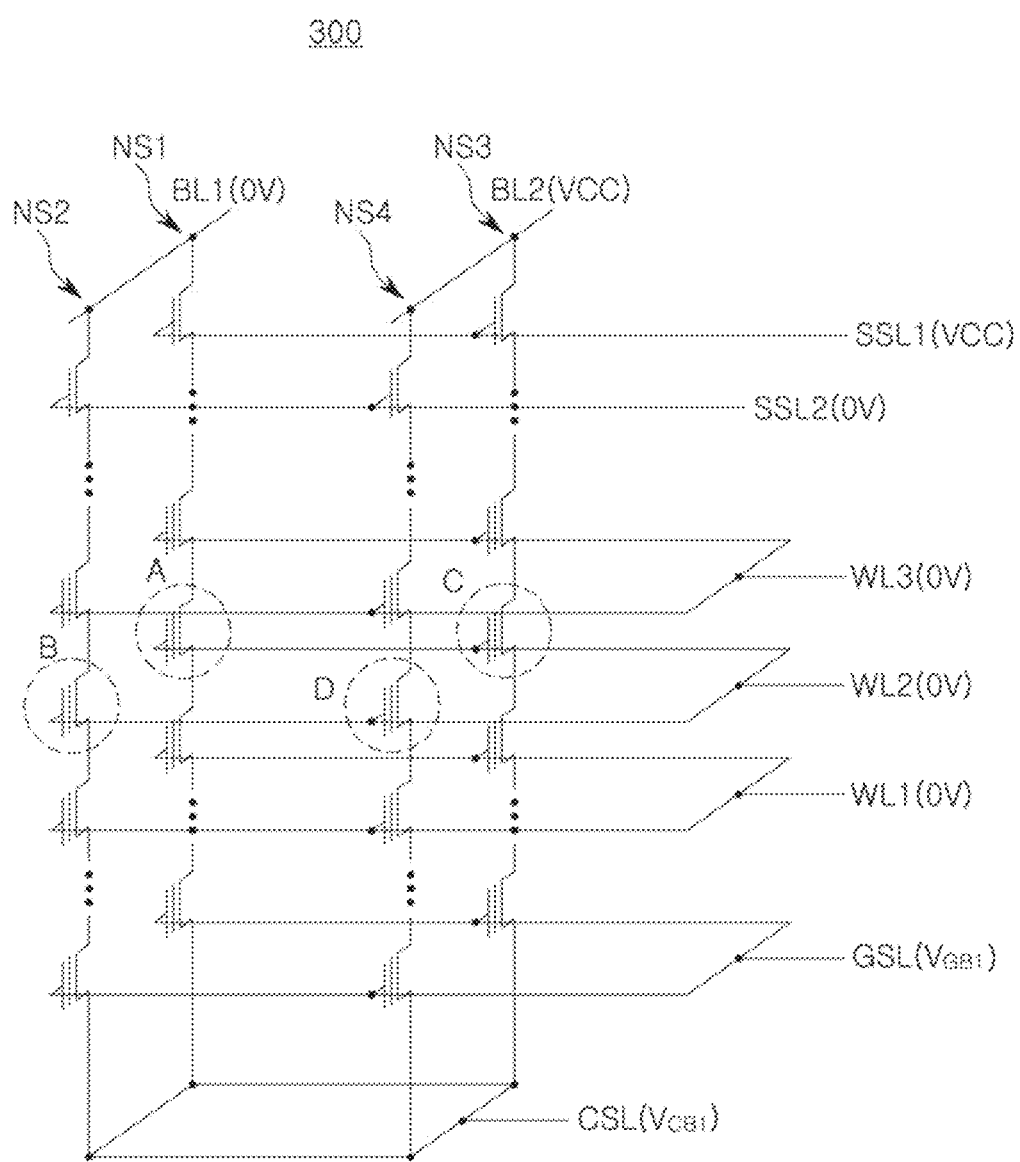
FIGS. 11 to 13 are diagrams provided to illustrate an operation of a semiconductor device according to some example embodiments.
Figure 12:
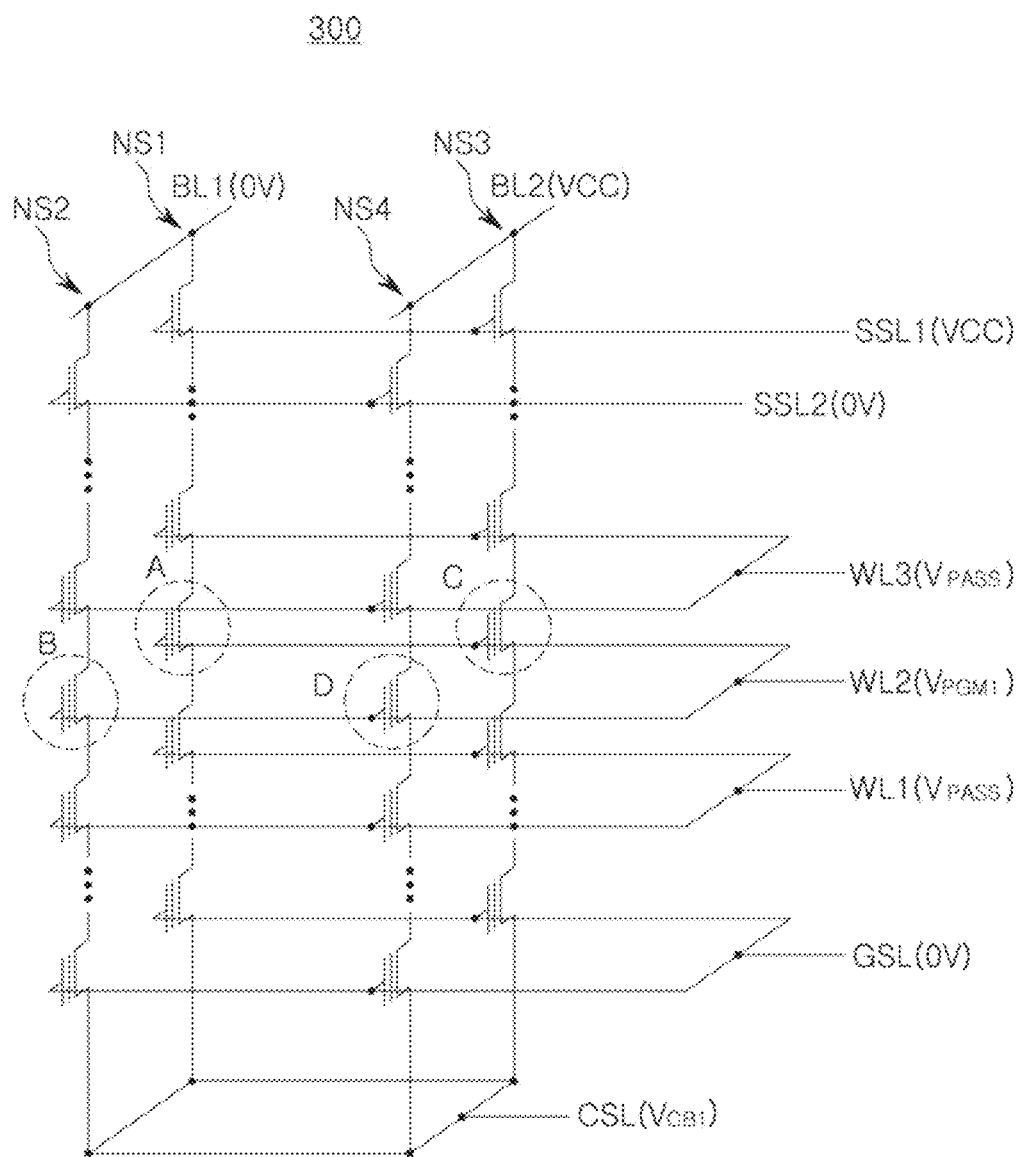
Figure 13:
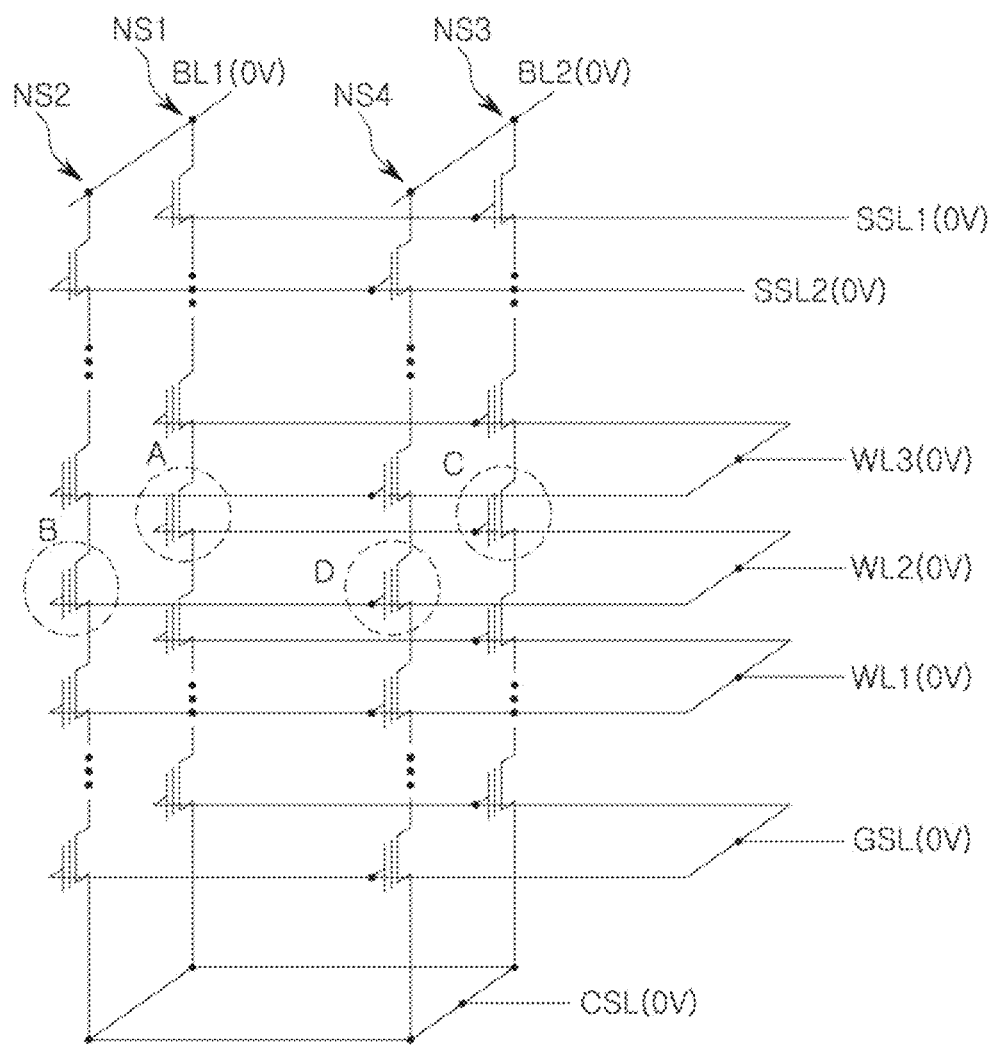

FIGS. 11 to 13 are diagrams provided to illustrate an operation of a semiconductor device according to some example embodiments.

Referring to FIGS. 11 to 13, a semiconductor device 300 may include a plurality of NAND strings NS1-NS4. The plurality of NAND strings NS1-NS4 are included in one block, and may thus share word lines WL1-WL3. The first and second NAND strings NS1 and NS2 may be commonly connected to a first bit line BL1, and the third and fourth NAND strings NS3 and NS4 may be commonly connected to a second bit line BL2.

Also, the first and third NAND strings NS1 and NS3 may be commonly connected to the first string select line SSL1, and the second and fourth NAND strings NS2 and NS4 may be commonly connected to the second string select line SSL2. The plurality of NAND strings NS1-NS4 may share one ground select line GSL and one common source line CSL. In some example embodiments illustrated with reference to FIGS. 11 to 13, a selected memory cell A may be included in a first NAND string NS1 and may be connected to a second word line WL2.

First, FIG. 11 may be a diagram illustrating bias voltages input to the plurality of NAND strings NS1-NS4 during a channel initialization time. Referring to FIG. 11, during the channel initialization time, a ground voltage may be input to the first bit line BL1 that is the selected bit line, and a power supply voltage VCC higher than the ground voltage may be input to the second bit line BL2 that is an unselected bit line. On the other hand, the power supply voltage VCC may be input to the first string select line SSL1 connected to the first NAND string NS1, and a ground voltage may be input to the second string select line SSL2. A ground voltage may be input to the word lines WL1-WL3.

On the other hand, during the channel initialization time, the first ground select bias voltage $V_{GB1}$ may be input to the ground select line GSL, and the first source bias voltage $V_{CB1}$ may be input to the common source line CSL. The ground select transistor connected to the ground select line GSL1 may be turned on by the first ground select bias voltage $V_{GB1}$, and accordingly, the voltage of the channel layer of the NAND strings NS1-NS4 may be boosted by the first source bias voltage $V_{CB1}$. However, the voltage of the channel layer of the first NAND string NS1 including the selected memory cell A may be boosted to a level lower than the voltage of the channel layer of the third and fourth NAND strings NS3 and NS4 by the ground voltage input to the first bit line BL1.

On the other hand, the channel layer of the second NAND string NS2 connected to the first bit line BL1 and including the unselected memory cell B may not be electrically connected to the first bit line BL1 by the ground voltage input to the second string select line SSL2. Accordingly, the voltage of the channel layer of the second NAND string NS2 may also be boosted by the first source bias voltage $V_{CB1}$.

As illustrated in FIG. 12, during the program execution time, the first program voltage $V_{PGM1}$ may be input to the second word line WL2, which is the program word line, and a pass voltage $V_{PASS}$ may be input to the remaining word lines WL1 and WL3. Since the voltage of the channel layer of the first and second NAND strings NS1 and NS2 is boosted to a level lower than the voltage of the channel layer of the third and fourth NAND strings NS3 and NS4, charges may move from the channel layer and be trapped in the charge storage layer due to a voltage difference between the first program voltage $V_{PGM1}$ and the voltage of the channel layer in the selected memory cell A. On the other hand, in the unselected memory cells B, C, and D, due to the voltage of the channel layer boosted to a relatively high level, charges may not be trapped in the charge storage layer.

FIG. 13 may be a diagram illustrating bias voltages input to a plurality of NAND strings NS1-NS4 during a program recovery time. During the program recovery time, bias voltages input to the plurality of NAND strings NS1-NS4 may be discharged.

FIGS. 11 to 13 may be diagrams illustrating bias voltages input to the plurality of NAND strings NS1 to NS4 during the first program time described with reference to FIG. 10 above. The second program time after the first program time may also include a channel initialization time, a program execution time, and a program recovery time. However, as described with reference to FIG. 10, during the program execution time of the second program time, the second program voltage $V_{PGM2}$ having a higher level than the first program voltage $V_{PGM1}$ may be input to the second word line WL2, which is a program word line.

Accordingly, in a case in which the voltage of the channel layer of the second to fourth NAND strings NS2-NS4 including the unselected memory cells B, C, and D is not sufficiently boosted, charges may be trapped in the charge storage layers of the unselected memory cells B, C, and D. In some example embodiments of the present inventive concepts, to prevent or reduce the above problem from occurring, a second ground select bias voltage $V_{GB2}$ greater than a first ground select bias voltage $V_{GB1}$ may be applied to the ground select line GSL during the second program time, and a second source bias voltage $V_{CB2}$ greater than the first source bias voltage $V_{CB1}$ may be input to the common source line CSL.

As described above, by increasing the level of the bias voltage input to the ground select line GSL and the common source line CSL, the voltage of the channel layer of the second to fourth NAND strings NS2-NS4 may be boosted to a higher level in the second program time than in the first program time. Accordingly, despite the second program voltage $V_{PGM2}$ greater than the first program voltage $V_{PGM1}$ being input to the second word line WL2 during the second program time, charges may be effectively prevented (or reduced) from being trapped in the charge trap layers of the unselected memory cells B, C, and D.

FIGS. 14 to 19 are diagrams provided to illustrate an operation of a semiconductor device according to some example embodiments.

Figure 14:
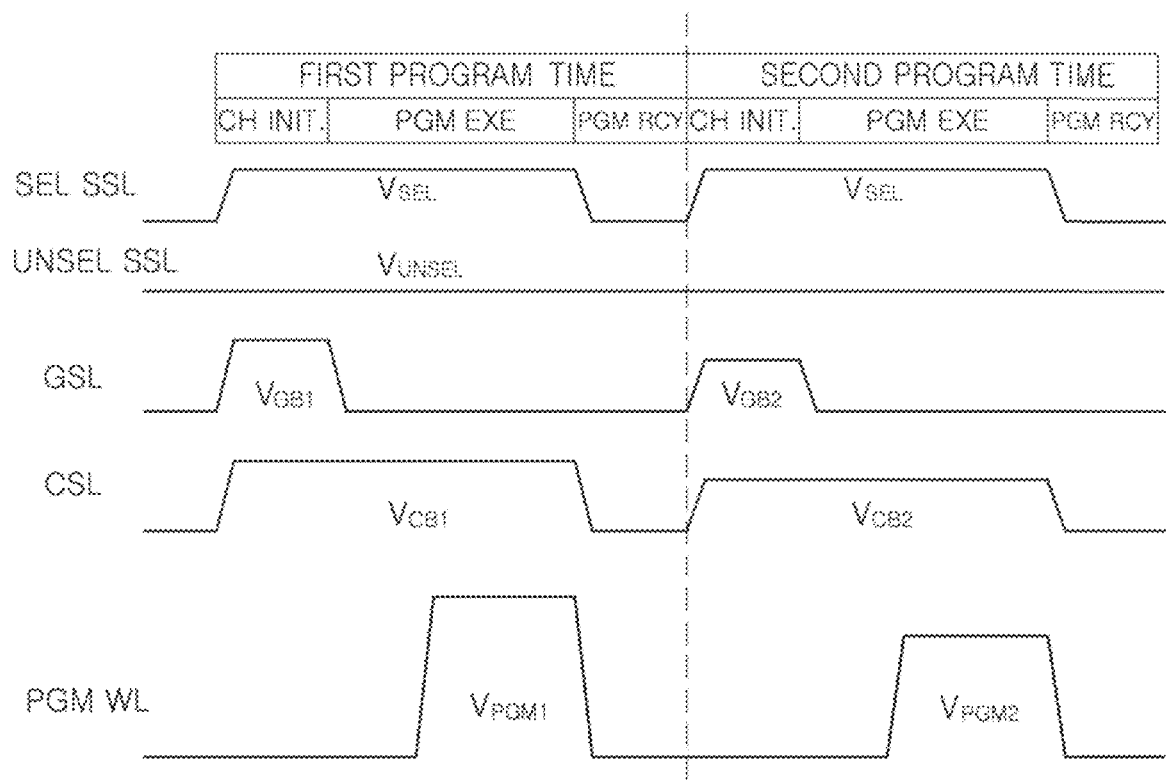
FIGS. 14 to 19 are diagrams provided to illustrate an operation of a semiconductor device according to some example embodiments.

Referring first to FIG. 14, similar to that described with reference to FIG. 10, in the peripheral circuit area, the program voltage may be input to the program word line PGM WL twice or more during the program operation. For example, the row decoder of the peripheral circuit area may input the first program voltage $V_{PGM1}$ to the program word line PGM WL during the first program time, and may input the second program voltage $V_{PGM2}$ to the program word line PGM WL during the second program time. In the example embodiments illustrated in FIG. 14, the first program voltage $V_{PGM1}$ may be greater than the second program voltage $V_{PGM2}$.

A bias voltage input to each of the string select lines SEL SSL and UNSEL SSL may be similar to that described above with reference to FIG. 10. However, in the example embodiments illustrated in FIG. 14, the magnitude of the first ground select bias voltage $V_{GB1}$ input to the ground select line GSL during the first program time may be greater than the level of the second ground select bias voltage $V_{GB2}$ input to the ground select line GSL during the second program time.

In addition, the magnitude of the first source bias voltage $V_{CB1}$ input to the common source line CSL during the first program time may be greater than the level of the second source bias voltage $V_{CB2}$ input to the common source line CSL during the second program time. This may be because the first program voltage $V_{PGM1}$ is greater than the second program voltage $V_{PGM2}$.

Figure 15:
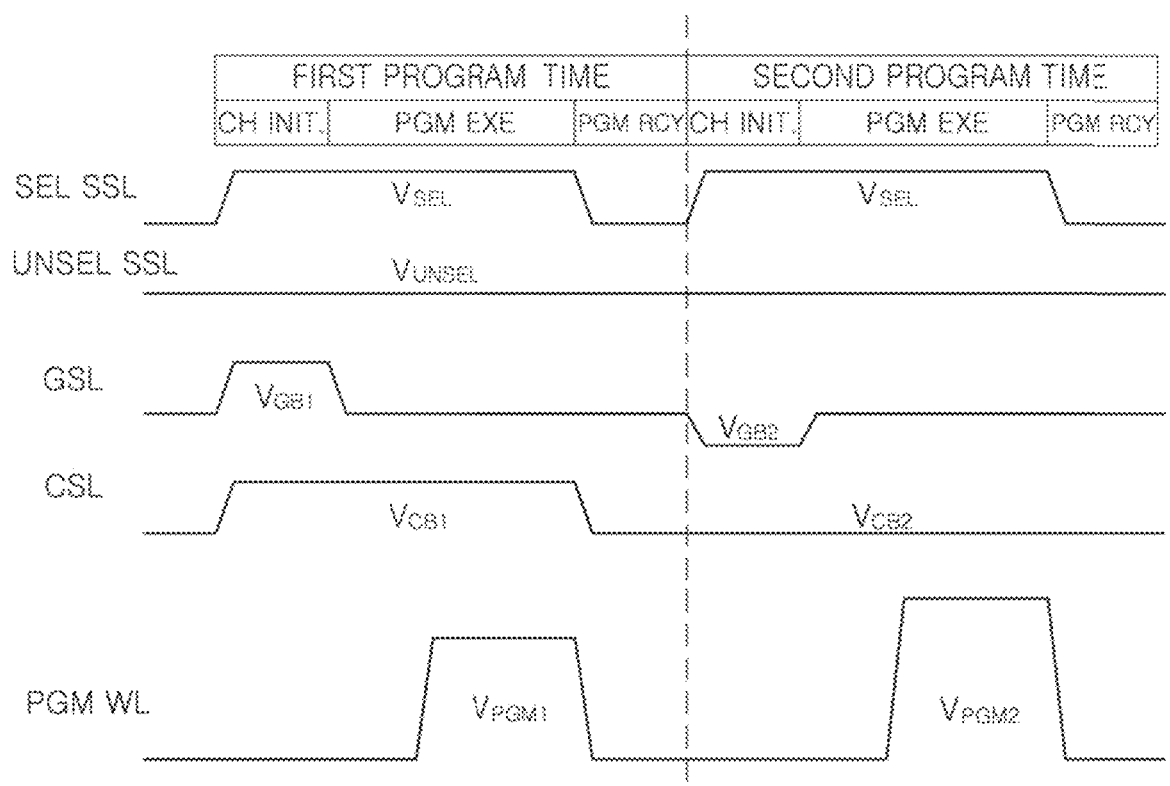

Next, referring to FIG. 15, the first program voltage $V_{PGM1}$ may be lower than the second program voltage $V_{PGM2}$. During the program operation, in the peripheral circuit area, the program voltage may be input to the program word line PGM WL twice or more, and may not execute the channel initialization operation after the first program time. In the example embodiments illustrated in FIG. 15, the channel initialization is not executed at the second program time, and accordingly, the second source bias voltage $V_{CB2}$ input to the common source line CSL during the second program time may have a level corresponding to the ground voltage.

If channel initialization is not executed during the second program time, a leakage current may flow from the channel layer boosted to a predetermined (or, alternatively, desired) level during the previous first program time, to the common source line CSL receiving the second source bias voltage $V_{CB2}$. In some example embodiments of the present inventive concepts, a negative voltage may be input to the ground select line GSL to block a leakage current flowing from the channel layer to the common source line CSL during the second program time. Referring to FIG. 15, after the second program time is started, a second ground select bias voltage $V_{GB2}$, which is a negative voltage, may be input to the ground select line GSL.

Figure 16:
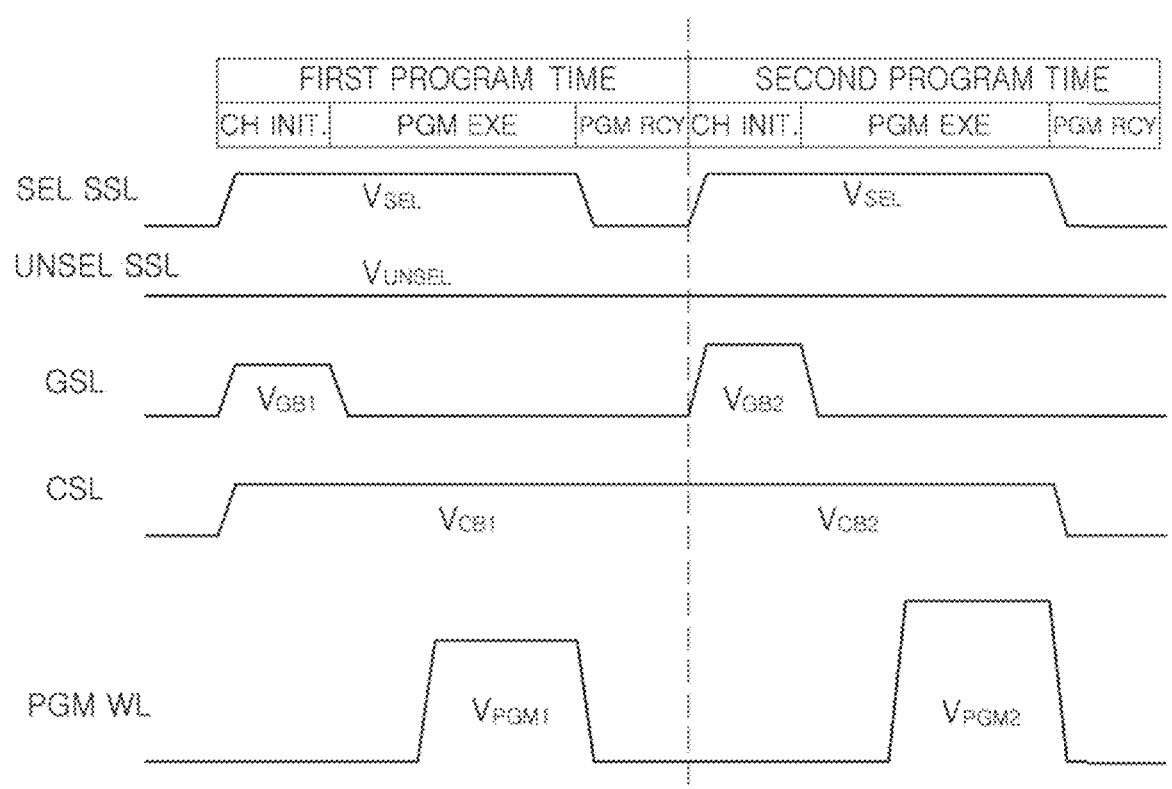
Figure 17:
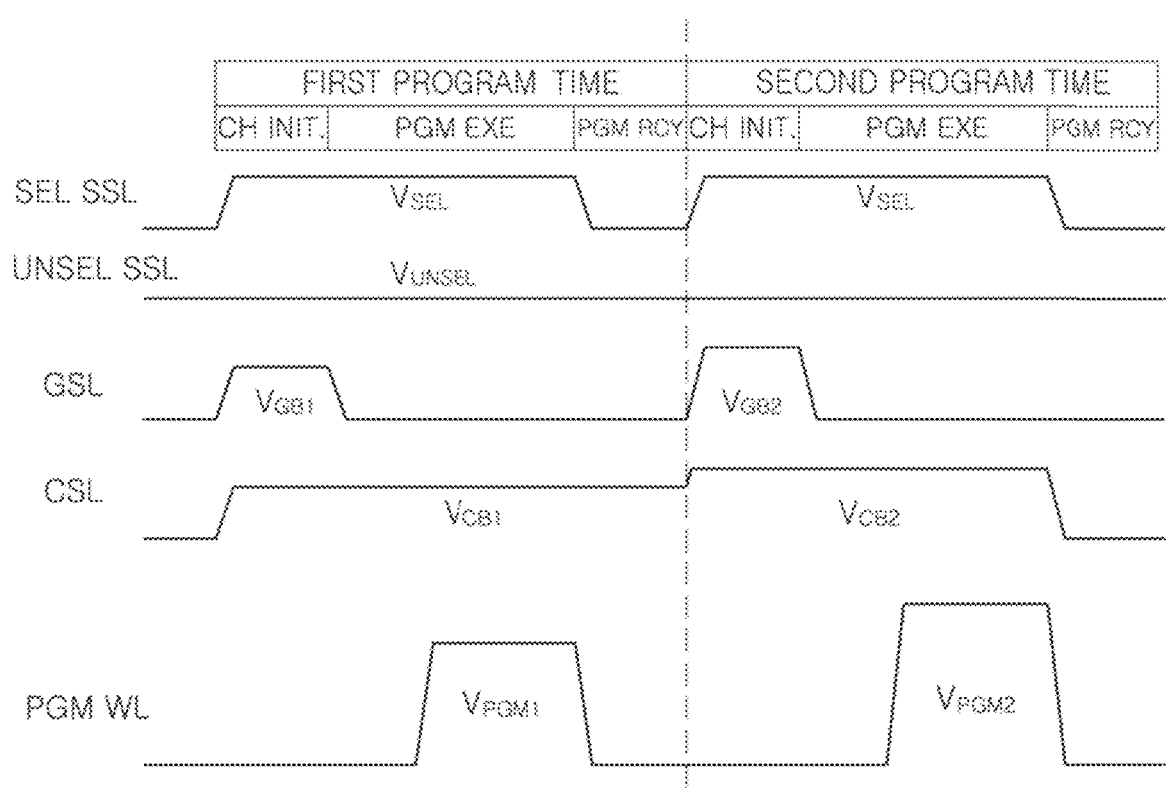

In the example embodiments illustrated in FIGS. 16 and 17, the voltage of the common source line CSL may not be discharged during the program recovery time of the first program time. First, referring to FIG. 16, unlike the first ground select bias voltage $V_{GB1}$ discharged after the channel initialization time of the first program time and the first program voltage $V_{PGM1}$ discharged during the program recovery time, the voltage of the common source line CSL may be maintained as the first source bias voltage $V_{CB}$.

When the second program time starts and the second ground select bias voltage $V_{GB2}$ is input to the ground select line GSL, the ground select transistor connected to the ground select line GSL may be turned on and the second source bias voltage $V_{CB2}$ may be input to the channel layer of the NAND strings. Accordingly, a channel initialization operation for boosting the voltage of the channel layer may be performed. Since the voltage of the common source line CSL is maintained without being discharged, the second source bias voltage $V_{CB2}$ may have the same level as the first source bias voltage $V_{CB1}$.

On the other hand, in the example embodiments illustrated in FIG. 17, the voltage of the common source line CSL may not be discharged during the program recovery time of the first program time. Also, during the channel initialization time of the second program time, the voltage of the common source line CSL may increase from the first source bias voltage $V_{CB1}$ to the second source bias voltage $V_{CB2}$. At the same time, as the ground select transistor is turned on by the second ground select bias voltage VGB2 input to the ground select line GSL during the channel initialization time, a channel initialization operation for boosting the channel voltage may be performed.

During the second program time, a second program voltage $V_{PGM2}$ greater than the first program voltage $V_{PGM1}$ may be input to the program word line PGM WL. As illustrated in FIG. 17, by inputting a second source bias voltage $V_{CB2}$ greater than the first source bias voltage $V_{CB1}$ to the common source line CSL during the channel initialization time of the second program time, the channel layer voltage of the NAND strings including unselected memory cells may be boosted to a higher level in the second program time than in the first program time. Accordingly, despite the second program voltage $V_{PGM2}$ greater than the first program voltage $V_{PGM1}$ being input to the program word line PGM WL, the occurrence of charge transfer in unselected memory cells connected to the program word line PGM WL may be significantly reduced.

The operations according to the example embodiments described with reference to FIGS. 16 and 17 may also be applied to the case in which the first program voltage $V_{PGM1}$ is lower than the second program voltage $V_{PGM2}$. For example, when the first program voltage $V_{PGM1}$ is less than the second program voltage $V_{PGM2}$, the voltage input to the common source line CSL may be maintained without discharging during the program recovery time of the first program time. Alternatively, when the voltage of the common source line CSL is maintained as the first source bias voltage $V_{CB1}$ without discharging during the first program time and the second program time starts, the voltage of the common source line CSL may be reduced from the first source bias voltage $V_{CB1}$ to the second source bias voltage $V_{CB2}$.

In a semiconductor device according to some example embodiments, memory cells disposed relatively far from a substrate from among a plurality of word lines may be first selected and programmed, and memory cells disposed relatively close to the substrate may be selected and programmed later. In terms of word lines, in the peripheral circuit area of the semiconductor device, a word line disposed at a relatively high position in a first direction perpendicular to the substrate is first selected as a program word line, and a word line disposed at a relatively lower position in the first direction may be selected as a program word line relatively late. For example, when a total of N word lines are stacked on the substrate, a first word line from an Nth word line may be sequentially selected as the program word line.

Since the word line relatively closer to the substrate is selected later, at the time of executing the program operation by selecting the word line closest to the substrate as the program word line, the voltage of the channel layer may have a relatively higher level due to the program operation on the first selected memory cells. Therefore, in a program operation in which a word line relatively closest to the substrate is selected as the program word line, a leakage current from the channel layer to the common source line may be relatively increased.

In some example embodiments of the present inventive concepts, by setting the magnitude of the bias voltage input to at least one of the ground select line and the common source line differently according to the position of the program word line, the above problems may be prevented or reduced. For example, the closer the program word line is to the substrate, for example, the greater the number of other memory cells connected between a selection memory cell connected to the program word line and a string select transistor is, the row decoder may reduce the magnitude of the bias voltage input to at least one of the ground select line and the common source line. Alternatively, the row decoder may reduce the magnitude of the bias voltage input to at least one of the ground select line and the common source line as the order of selection of the program word lines rather than the position of the program word lines is delayed, which will be described below in more detail with reference to FIGS. 18 and 19.

Figure 18:
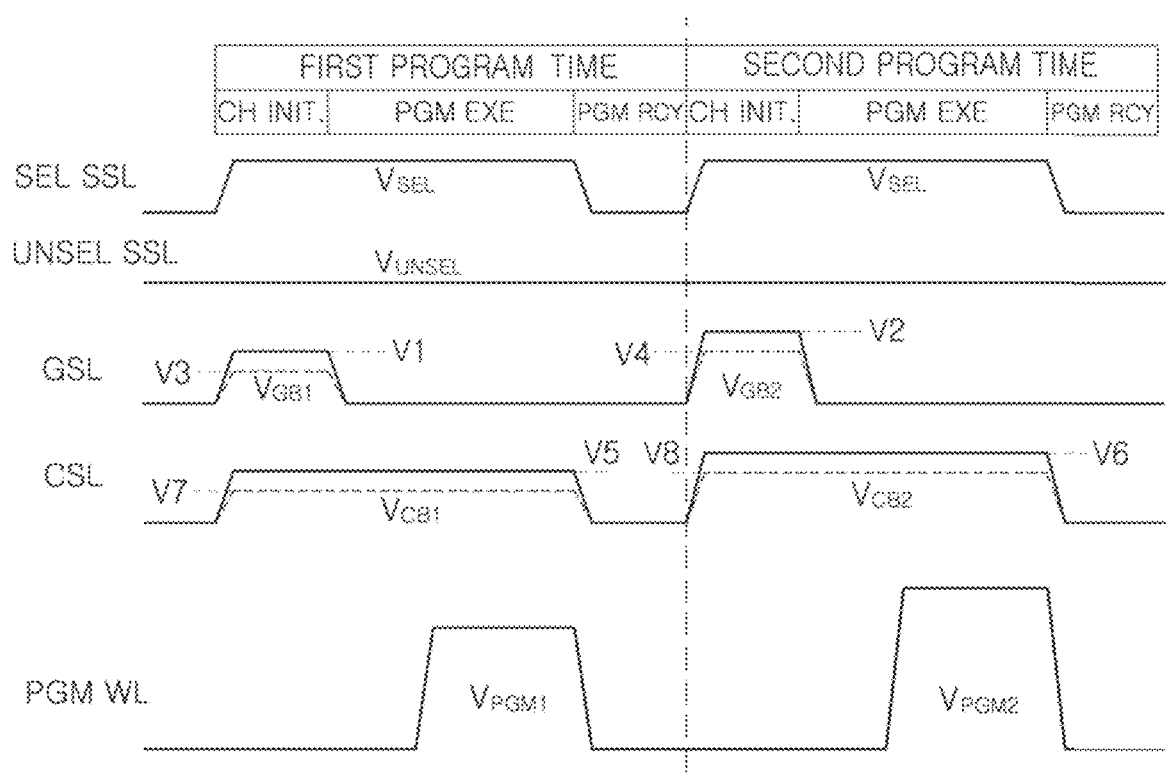
Figure 19:
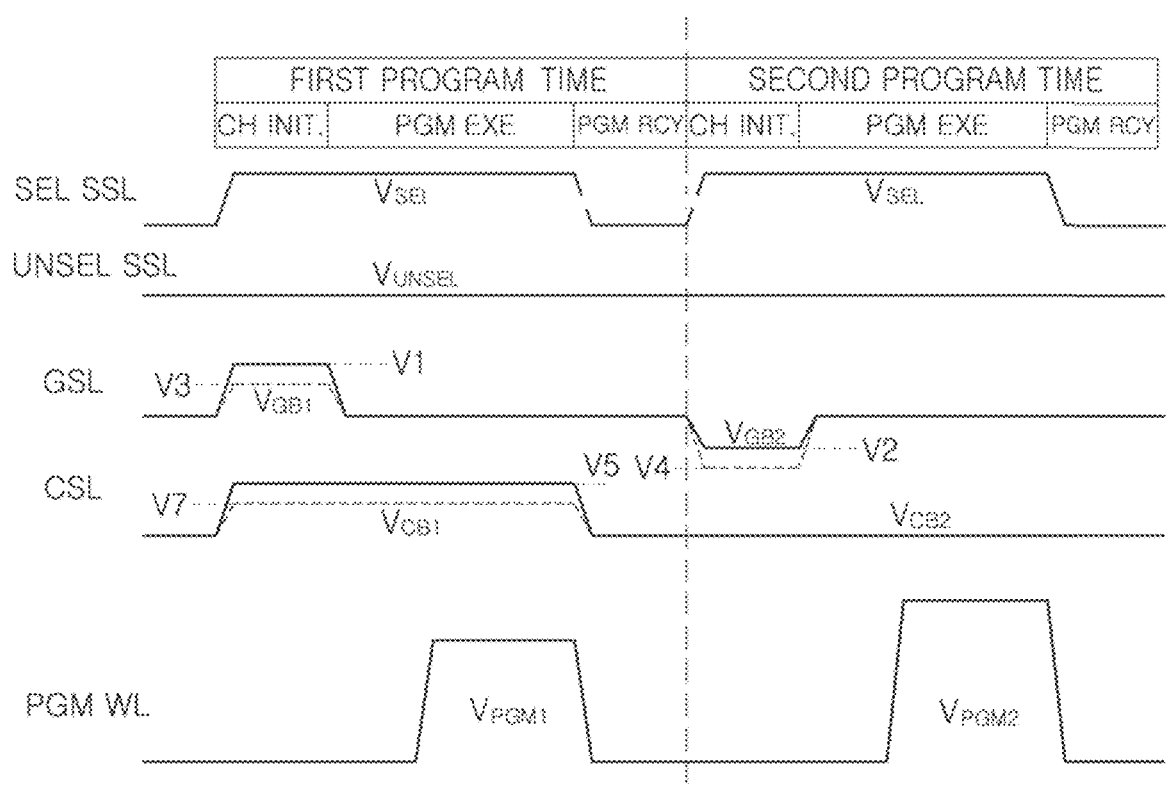

Referring to FIGS. 18 and 19, during a program operation, in the peripheral circuit area, a program voltage may be input to the program word line PGM WL twice or more. For example, the row decoder of the peripheral circuit area may input the first program voltage $V_{PGM1}$ to the program word line PGM WL during the first program time, and may input the second program voltage $V_{PGM2}$ to the program word line PGM WL during the second program time. In the example embodiments described with reference to FIGS. 18 and 19, it is assumed that the first program voltage $V_{PGM1}$ is less than the second program voltage $V_{PGM2}$. However, the first program voltage $V_{PGM1}$ may be greater than the second program voltage $V_{PGM2}$.

A bias voltage input to each of the string select lines SEL SSL and UNSEL SSL, the ground select line GSL, and the common source line CSL may be similar to that described above. For example, the first ground select bias voltage $V_{GB1}$ may be input to the ground select line GSL during the first program time, and a second ground select bias voltage $V_{GB2}$ greater than the first ground select bias voltage $V_{GB1}$ may be input to the ground select line GSL during the second program time. In addition, the first source bias voltage $V_{CB1}$ may be input to the common source line CSL during the first program time, and a second source bias voltage $V_{CB2}$ greater than the first source bias voltage $V_{CB1}$ may be input to the common source line CSL during the second program time. For example, an unintentional transfer of charges and an unintentional data change in unselected memory cells may be prevented or reduced by sufficiently boosting the voltage of the channel layer during the second program time for which the second program voltage $V_{PGM2}$ greater than the first program voltage $V_{PGM1}$ is input.

Also, in the example embodiments illustrated in FIGS. 18 and 19, each voltage level of the first ground select bias voltage $V_{GB1}$, the second ground select bias voltage $V_{GB2}$, the first source bias voltage $V_{CB1}$ and the second source bias voltage $V_{CB2}$ may be determined differently depending on the position of the program word line PGM WL.

First, referring to FIG. 18, when a first word line among a plurality of word lines is selected as a program word line, the level of the first ground select bias voltage $V_{GB1}$ may be determined as a first level V1 and the level of the second ground select bias voltage $V_{GB2}$ may be determined as the second level V2. As described above, the second level V2 may be greater than the first level V1.

On the other hand, when a second word line closer to the substrate than the first word line among the plurality of word lines is selected as the program word line, the level of the first ground select bias voltage $V_{GB1}$ may be determined as the third level V3, and the level of the second ground select bias voltage $V_{GB2}$ may be determined as the fourth level V4. The fourth level V4 may be greater than the third level V3. Also, the third level V3 may be lower than the first level V1, and the fourth level V4 may be lower than the second level V2.

In addition, the voltage of the common source line CSL as well as the voltage of the ground select line GSL may vary depending on the position of the program word line. When a first word line from among the plurality of word lines is selected as a program word line, the level of the first source bias voltage $V_{CB1}$ may be determined as the fifth level V5 and the level of the second source bias voltage $V_{CB2}$ may be determined as the sixth level V6. The sixth level V6 may be greater than the fifth level V5.

Next, when the second word line closer to the substrate than the first word line is selected as the program word line, the level of the first source bias voltage $V_{CB1}$ may be determined as the seventh level V7, and the level of the second source bias voltage $V_{CB2}$ may be determined as the eighth level V8. The eighth level V8 may be greater than the seventh level V7. Also, the seventh level V7 may be lower than the fifth level V5, and the eighth level V8 may be lower than the sixth level V6.

The second word line is disposed closer to the substrate than the first word line, and for example, the second word line may be positioned between the first word line and the substrate in a direction perpendicular to the upper surface of the substrate. Also, the second word line may be selected later than the first word line, as the program word line. Since, prior to selecting the second word line as the program word line, at least one other word line including the first word line is preselected (for example, selected prior to or at the same time the second word line is selected as the program word line) as the program word line; in the program operation in which the second word line is selected as the program word line, the voltage of the channel layer may be boosted to a relatively higher level than in the previously executed program operation. As the voltage of the channel layer is boosted to a higher level, in a case in which the second word line is selected as the program word line, a leakage current from the channel layer to the common source line CSL may relatively increase.

Accordingly, as illustrated in FIG. 18, as the program word line is closer to the substrate, the magnitude of the first ground select bias voltage $V_{GB1}$ and the second ground select bias voltage $V_{GB2}$ input to the ground select line GSL, and the magnitude of the first source bias voltage $V_{CB1}$ and the second source bias voltage $V_{CB2}$ input to the common source line CSL, may be reduced, thereby reducing the effect of leakage current. According to some example embodiments, only the bias voltage input to the ground select line GSL or the bias voltage input to the common source line CSL may be set differently depending on the position of the program word line.

In the example embodiments illustrated in FIG. 19, in the program operation after the first program operation, for example, in the second program operation, a ground voltage may be input to the common source line CSL and a negative voltage may be input to the ground select line GSL. Accordingly, in the example embodiments illustrated in FIG. 19, the channel initialization operation may not be executed in the second program operation.

Referring to FIG. 19, when a first word line is selected as a program word line among a plurality of word lines, the level of the first ground select bias voltage $V_{GB1}$ may be determined as the first level V1, and the level of the second ground select bias voltage $V_{GB2}$ may be determined as the second level V2. Since the channel initialization operation is not executed in the second program operation, the second level V2 may be a level of a negative voltage less than 0.

When a second word line closer to the substrate than the first word line among the plurality of word lines is selected as the program word line later than the first word line, the level of the first ground select bias voltage $V_{GB1}$ may be determined as the third level V3, and the level of the second ground select bias voltage $V_{GB2}$ may be determined as the fourth level V4. The third level V3 may be lower than the first level V1, and the fourth level V4 may be lower than the second level V2. As illustrated in FIG. 19, the fourth level V4 may be a negative voltage, and the absolute value of the fourth level V4 may be greater than the absolute value of the second level V2.

The voltage of the common source line CSL may also vary depending on the position of the program word line. When the first word line is selected as the program word line, the level of the first source bias voltage $V_{CB1}$ may be determined as the fifth level V5 and the level of the second source bias voltage $V_{CB2}$ may be determined as the ground voltage. Next, when the second word line closer to the substrate than the first word line is selected as the program word line, the level of the first source bias voltage $V_{CB1}$ may be determined as the seventh level V7 lower than the fifth level V5, and the level of the second source bias voltage $V_{CB2}$ may be determined as the ground voltage.

A voltage of the channel layer at a point in time at which the second word line is selected as a program word line may be greater than a voltage of the channel layer at a point in time at which the first word line is selected as a program word line, and a leakage current from the channel layer toward the common source line CSL may increase. In the example embodiments illustrated in FIG. 19, when the second word line is selected, by inputting a negative voltage having a relatively greater absolute value to the ground select line GSL as the second ground select bias voltage $V_{GB2}$, the influence of leakage current in the second program operation in which channel initialization is not executed may be reduced.

Some example embodiments in which the level of the voltage input to the ground select line GSL and the common source line CSL is differently determined depending on the position of the program word line among the plurality of word lines may also be applied to some example embodiments in which the voltage of the common source line CSL is not discharged. For example, when the first word line is selected as the program word line in the example embodiments described with reference to FIGS. 16 and 17, the level of the voltage input to the ground select line GSL and the common source line CSL when the second word line closer to the substrate than the first word line is selected as the program word line may be higher than the level of the voltage input to the ground select line GSL and the common source line CSL.

Figure 20:
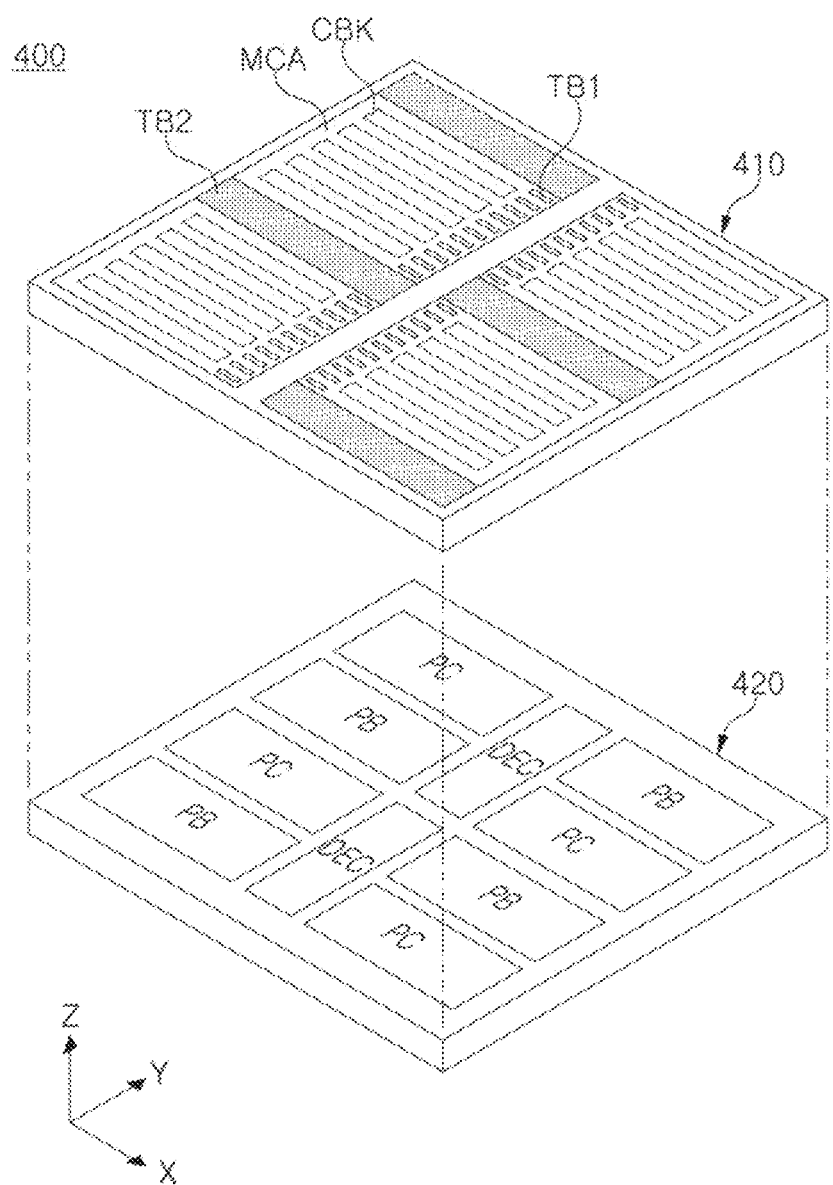
FIGS. 20 and 21 are diagrams schematically illustrating a semiconductor device according to some example embodiments.
Figure 21:
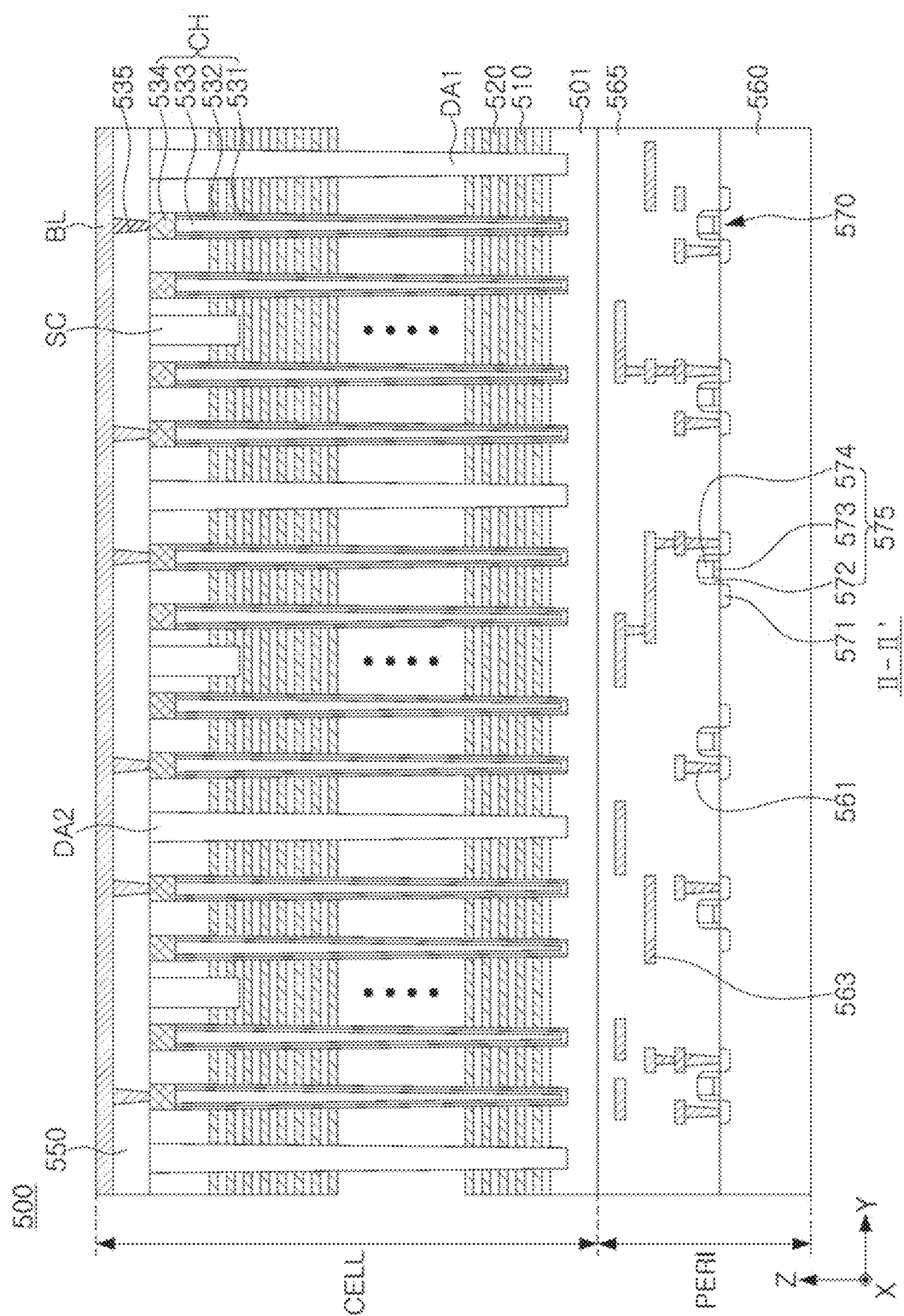

FIGS. 20 and 21 are diagrams schematically illustrating a semiconductor device according to some example embodiments.

Referring to FIG. 20, a semiconductor device 400 may include a first region 410 and a second region 420 stacked in a first direction (Z-axis direction). The first region 410 may be a cell area, and the second region 420 may be a peripheral circuit area. The first region 410 may include memory cell arrays MCA and first and second through-wiring regions TB1 and TB2 formed on the first substrate. Through-wires connecting the first region 410 and the second region 420 and extending in the first direction (Z-axis direction) may be disposed in each of the first and second through-wiring regions TB1 and TB2.

Each of the memory cell arrays MCA may include a plurality of blocks BLK. The plurality of blocks BLK may extend in a second direction (X-axis direction) and may be arranged in a third direction (Y-axis direction). The plurality of blocks BLK may be divided by a plurality of first separation regions extending in the second direction, and a plurality of second separation regions may be disposed inside each of the plurality of blocks BLK.

In some example embodiments, the plurality of blocks BLK may include at least one dummy block and at least one spare block. Memory cells for storing data in the semiconductor device 400 may not be disposed in the dummy block. The spare block includes a memory cell like other blocks BLK, and may store data when characteristics of the other blocks BLK are deteriorated or a deterioration compensation operation is performed on the blocks BLK.

The second region 420 may include a row decoder DEC, a page buffer PB, and a peripheral circuit PC formed on the second substrate. For example, the peripheral circuit PC may include a voltage generator, a source driver, an input/output circuit, and the like. The row decoder DEC and the page buffer PB may be connected to the first region 410 through the first and second through interconnection regions TB1 and TB2.

The row decoder DEC may be connected to the memory cell array MCA through word lines, string select lines, ground select lines, and a common source line. The page buffer PB may be connected to the memory cell array MCA through bit lines. As described above, in the program operation, the row decoder DEC may input a program voltage by selecting a program word line from among the word lines. Also, the row decoder DEC may determine different levels of voltages input to the ground select lines and the common source line according to the level of the program voltage.

In addition, the row decoder DEC may determine different levels of voltages input to the ground select lines and the common source line according to the position of the word line selected as the program word line or the order in which the corresponding word line is selected as the program word line. For example, the row decoder DEC may input a relatively low voltage to the ground select lines and the common source line when inputting a program voltage to a word line that is selected relatively later as a program word line within one block.

FIG. 21 may be a cross-sectional view illustrating a partial region of a semiconductor device 500 having the same structure as that in the example embodiments illustrated in FIG. 20. Referring to FIG. 21, in the cell area CELL, a plurality of gate electrode layers 510 and a plurality of insulating layers 520 alternately stacked in the first direction (Z-axis direction), and a plurality of channel structures CH extending in the first direction and penetrating through the plurality of gate electrode layers 510, may be disposed. A first interlayer insulating layer 550 may be disposed on the plurality of gate electrode layers 510 and the plurality of channel structures CH.

The plurality of channel structures CH may extend to a depth that recesses a portion of the first substrate 501 of the cell area CELL. The plurality of gate electrode layers 510 are formed of a conductive material such as metal or metal silicide, and each of the plurality of channel structures CH may include a gate dielectric layer 531, a channel layer 532, a buried insulating layer 533, and a drain region 534. The drain region 534 of each of the plurality of channel structures CH may be connected to the bit lines BL through the channel contact 535 inside the first interlayer insulating layer 550.

The cell area CELL may include a plurality of blocks BLK, and the plurality of blocks BLK may be divided by a plurality of first separation regions DA1 extending in the second direction (X-axis direction) and may be arranged in the third direction (Y-axis direction). Each of the plurality of first separation regions DA1 may extend in the second direction to traverse the cell area CELL, and may be formed of an insulating material. For example, each of the plurality of first separation regions DA1 may be formed of silicon oxide, silicon nitride, or the like.

A plurality of second separation regions DA2 and an upper separation layer SC may be disposed inside each of the plurality of blocks BLK. The plurality of second separation regions DA2 and the upper separation layer SC may extend in the second direction, like the plurality of first separation regions DA1. Unlike the plurality of first separation regions DA1 and the plurality of second separation regions DA2, the upper separation layer SC may divide only some gate electrode layers 510, disposed in an upper portion in the first direction and providing string select lines, into a plurality of regions. Accordingly, in the example embodiments illustrated in FIG. 21, the number of string select lines included in one block may be greater than the number of ground select lines.

In the peripheral circuit area PERI, a plurality of devices 570, a plurality of device contacts 561 connected to the plurality of devices 570, and a plurality of wiring patterns 563 may be formed. The plurality of devices 570 may be formed on a second substrate 560, and the plurality of devices 570, the plurality of device contacts 561, and the plurality of wiring patterns 563 may be covered by a second interlayer insulating layer 565. A first substrate 501 of the cell area CELL may be disposed on the upper surface of the second interlayer insulating layer 565. Each of the plurality of devices 570 may include a source/drain region 571 and a gate structure 575, and the gate structure 575 may include a gate spacer 572, a gate insulating layer 573, and a gate conductive layer 574.

Figure 22:
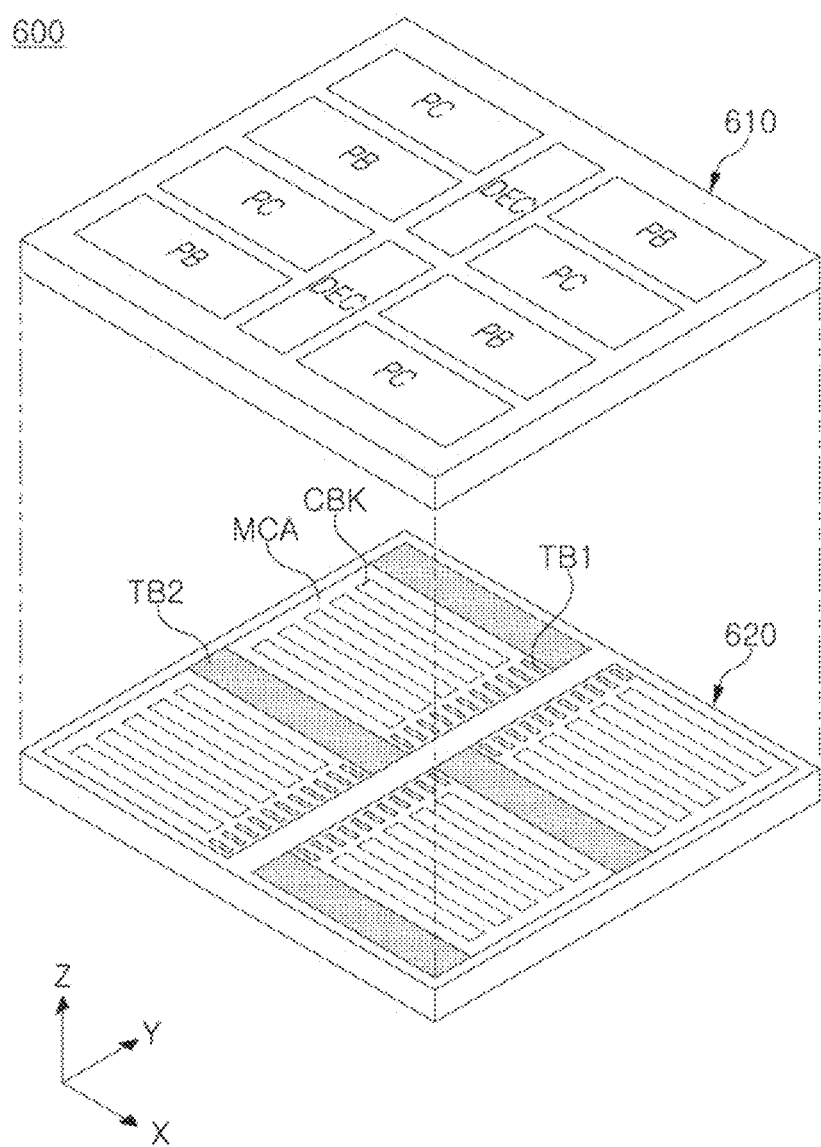
FIGS. 22 and 23 are diagrams schematically illustrating a semiconductor device according to some example embodiments.
Figure 23:
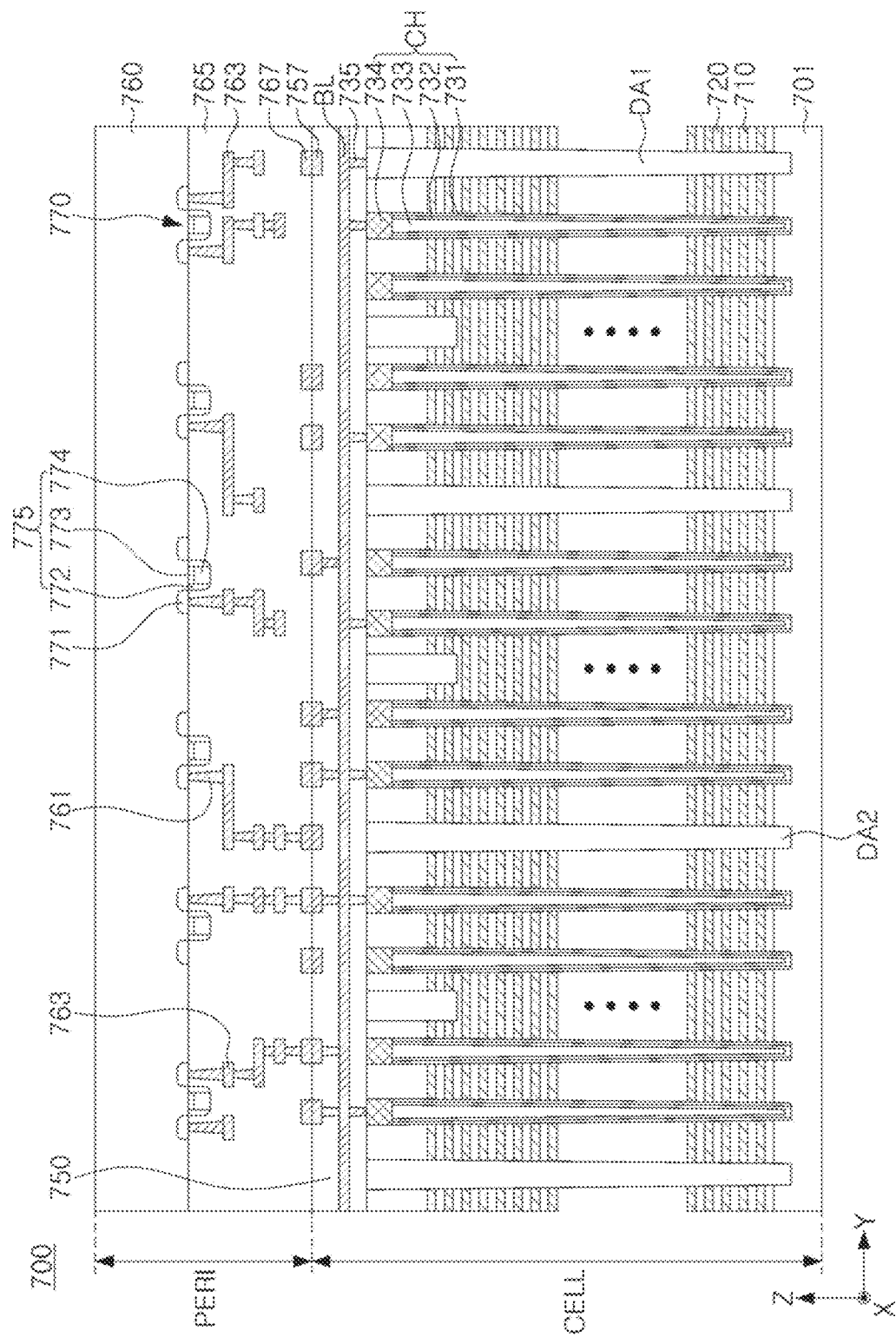

FIGS. 22 and 23 are diagrams schematically illustrating a semiconductor device according to some example embodiments.

Referring to FIG. 22, a semiconductor device 600 may include a first region 610 and a second region 620 stacked in a first direction (Z-axis direction). The first region 610 may be a cell area, and the second region 620 may be a peripheral circuit area. The configuration of each of the first region 610 and the second region 620 may be similar to that described above with reference to FIG. 20.

However, unlike the example embodiments previously described with reference to FIG. 20, in the example embodiments illustrated in FIG. 22, the second region 620 including the peripheral circuit area may be inverted and combined with the first region 610. Accordingly, devices which are included in the first region 610 and provide a row decoder DEC, a page buffer PB and a peripheral circuit PC, and gate electrode layers, channel structures and bit lines which are included in the second region 620, may be disposed between a first substrate of the first region 610 and a second substrate of the second region 620 in the first direction.

The row decoder DEC may be connected to a memory cell array MCA through word lines, string select lines, ground select lines, and a common source line, and the page buffer PB may be connected to the memory cell array MCA through bit lines. In the program operation, the row decoder DEC may input a program voltage by selecting a program word line from among the word lines. In addition, depending on the magnitude of the program voltage, the row decoder DEC may determine the magnitude of the voltage input to the ground select lines and the common source line differently depending on the position of the word line selected as the program word line and the order in which the corresponding word line is selected as the program word line, or the like.

For example, the row decoder DEC may increase the voltages input to the ground select lines and the common source line as the program voltage increases. Alternatively, as the word line selected relatively later as the program word line increases, the magnitude of the voltage input to the ground select lines and the common source line may be reduced. In some example embodiments, when the upper word line is first selected as the program word line and the lower word line is later selected as the program word line, and in the case in which the lower word line is selected as the program word line, the magnitude of the voltage input to the ground select lines and the common source line may be reduced, thereby reducing the influence of the leakage current flowing from the channel layer to the common source line.

Next, referring to FIG. 23, a semiconductor device 700 may include a cell area CELL and a peripheral circuit area PERI stacked in a first direction (Z-axis direction). As described above with reference to FIG. 22, the peripheral circuit area PERI may be stacked with the cell area CELL that is in an inverted state. Therefore, devices 770 in the peripheral circuit area PERI, gate electrode layers 710 and channel structures CH in the cell area CELL, and the like may be disposed between a first substrate 701 of the cell area CELL and a second substrate 760 of the peripheral circuit area PERI.

For example, the semiconductor device 700 may have a chip to chip (C2C) structure. The C2C structure may refer to the structure provided by fabricating a first chip including the cell area CELL on a first wafer, manufacturing a second chip including the peripheral circuit area PERI on a second wafer different from the first wafer, and connecting the first chip and the second chip to each other by a bonding method. For example, the bonding method may refer to a method of physically and electrically connecting the bonding pad formed on the uppermost wiring pattern layer of the first chip and the bonding pad formed on the uppermost wiring pattern layer of the second chip to each other. For example, when the bonding pad is formed of copper (Cu), the bonding method may be a Cu—Cu bonding method, and the bonding pad may be formed of aluminum or tungsten.

The cell area CELL may include a plurality of gate electrode layers 710 and a plurality of insulating layers 720 that are alternately stacked in a first direction perpendicular to the upper surface of the first substrate 701, a plurality of channel structures CH passing through the plurality of gate electrode layers 710 and the plurality of insulating layers 720, and the like. Each of the plurality of channel structures CH may include a gate dielectric layer 731, a channel layer 732, a buried insulating layer 733, a drain region 734, and the like. The drain region 734 may be connected to the bit lines BL through a channel contact 735. The bit lines BL may be electrically connected to at least one of the devices 770 in the peripheral circuit area PERI through a first bonding pad 757 formed on the first interlayer insulating layer 750, and for example, the device 770 connected to the bit lines BL may be one of devices providing a page buffer.

The peripheral circuit area PERI may include the plurality of devices 770 formed on the second substrate 760 and a plurality of wiring patterns 763 connected to the plurality of devices 770. The plurality of wiring patterns 763 may be connected to the plurality of devices 770 through a device contact 761, and the plurality of devices 770 and the plurality of wiring patterns 763 may be disposed in a second interlayer insulating layer 765. The plurality of wiring patterns 763 may be physically and electrically connected to the first bonding pad 757 of the cell area CELL through a second bonding pad 767 formed on the second interlayer insulating layer 765.

To efficiently connect the peripheral circuit area PERI and the cell area CELL, the arrangement of circuits included in the peripheral circuit area PERI may be determined according to the structure of the cell area CELL. For example, devices providing a page buffer among the plurality of devices 770 may be disposed in the peripheral circuit area PERI to be positioned above the plurality of channel structures CH. In addition, among the plurality of devices 770 in the peripheral circuit area PERI, devices providing a row decoder may be disposed in the peripheral circuit area PERI, to be positioned above cell contacts connected to the plurality of gate electrode layers 710.

As set forth above, according to some example embodiments, a semiconductor device may sequentially input a first program voltage and a second program voltage to one program word line connected to a selected memory cell during a program operation. Depending on a difference in magnitude between the first program voltage and the second program voltage, the magnitudes of voltages input to the ground select line, the source region and the like may vary, and disturbance in which threshold voltages of unselected memory cells connected to the program word line are unintentionally changed may be significantly reduced, and the performance of the semiconductor device may be improved. In addition, stable operation of the semiconductor device may be secured by changing the magnitude of the voltage input to the ground select line and the source region according to the position of the program word line.

The semiconductor device 10 (or other circuitry, for example, the memory controller 20, control logic circuit 31, page buffer unit 34, first to fourth mats 41-44, logic circuit 45, page buffer unit 53, input/output circuit 54, semiconductor device 600, first region 610, second region 620, or other circuitry discussed herein) may include hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While example embodiments have been illustrated and described above, it will be apparent to those skilled in the art that modifications and variations could be made without departing from the scope of the present inventive concepts as defined by the appended claims.

What is claimed is:

1. A semiconductor device comprising:
   a cell area including
      a plurality of word lines stacked on a substrate,
      at least one ground select line between the plurality of word lines and the substrate, and
      a plurality of channel structures extending in a first direction, perpendicular to the substrate, and passing through the plurality of word lines and the at least one ground select line; and
   a peripheral circuit area including peripheral circuits configured to
      control the cell area, and
      input a program voltage to at least a portion of the plurality of word lines in an order of approaching the substrate along the first direction,
      input a first ground select bias voltage to the at least one ground select line during a first program time for inputting a first program voltage to a program word line among the plurality of word lines, and
      input a second ground select bias voltage having a magnitude different from a magnitude of the first ground select bias voltage to the at least one ground select line during a second program time for inputting a second program voltage having a magnitude different from a magnitude of the first program voltage to the program word line.

2. The semiconductor device of claim 1, wherein
   a magnitude of the first program voltage is lower than a magnitude of the second program voltage, and
   the magnitude of the first ground select bias voltage is lower than the magnitude of the second ground select bias voltage.

3. The semiconductor device of claim 1, wherein
   a magnitude of the first program voltage is greater than a magnitude of the second program voltage, and
   the magnitude of the first ground select bias voltage is greater than the magnitude of the second ground select bias voltage.

4. The semiconductor device of claim 1, wherein the peripheral circuits are configured to determine the magnitude of the first ground select bias voltage as a first level during the first program time and to determine the magnitude of the second ground select bias voltage as a second level during the second program time, based on a first word line among the plurality of word lines being selected as the program word line.

5. The semiconductor device of claim 4, wherein the peripheral circuits are configured to
   determine the magnitude of the first ground select bias voltage is a third level, based on a second word line closer to the substrate than the first word line in the first direction among the plurality of word lines being selected as the program word line, the third level being lower than the first level during the first program time, and
   determine the magnitude of the second ground select bias voltage is a fourth level, lower than the second level, during the second program time.

6. The semiconductor device of claim 1, wherein
   the cell area further includes a source region in the substrate and electrically connected to the plurality of channel structures, and
   the peripheral circuits are configured to
      input a first source bias voltage to the source region during the first program time, and
      input a second source bias voltage having a magnitude different from a magnitude of the first source bias voltage to the source region during the second program time.

7. The semiconductor device of claim 6, wherein, the peripheral circuits are configured to
   input the first source bias voltage at a lower magnitude than a magnitude of the second source bias voltage based on a magnitude of the first program voltage being lower than a magnitude of the second program voltage, and
   input the first source bias voltage at a greater magnitude than the magnitude of the second source bias voltage based on the magnitude of the first program voltage being greater than the magnitude of the second program voltage.

8. The semiconductor device of claim 6, wherein the second source bias voltage is a ground voltage.

9. The semiconductor device of claim 8, wherein the second ground select bias voltage is a negative voltage.

10. The semiconductor device of claim 6, wherein
    during the first program time, a time for which the first ground select bias voltage is input to the at least one ground select line is shorter than a time for which the first source bias voltage is input to the source region, and
    during the second program time, a time for which the second ground select bias voltage is input to the at least one ground select line is shorter than a time for which the second source bias voltage is input to the source region.

11. The semiconductor device of claim 6, wherein
    each of the first program time and the second program time includes a channel initialization time, a program execution time, and a program recovery time, and
    the peripheral circuits are configured to discharge the first ground select bias voltage and the second ground select bias voltage during the program execution time.

12. The semiconductor device of claim 11, wherein the peripheral circuits are configured to discharge the first source bias voltage and the second source bias voltage during the program recovery time.

13. The semiconductor device of claim 6, wherein based on a first word line, among the plurality of word lines, being selected as the program word line, the peripheral circuits are configured to determine the magnitude of the first source bias voltage as a fifth level during the first program time, and determine the magnitude of the first ground select bias voltage as a sixth level different from the fifth level during the second program time.

14. The semiconductor device of claim 13, wherein based on a second word line, among the plurality of word lines, closer to the substrate than the first word line in the first direction being selected as the program word line, the peripheral circuits are configured to determine the magnitude of the first source bias voltage as a seventh level lower than the fifth level during the first program time, and determine the magnitude of the second ground select bias voltage as an eighth level lower than the sixth level during the second program time.

15. A semiconductor device comprising:
a cell area including
a plurality of word lines stacked on a substrate,
at least one ground select line between the plurality of word lines and the substrate,
a plurality of channel structures extending in a first direction, perpendicular to the substrate, and passing through the plurality of word lines and the at least one ground select line, and
a source region in the substrate and electrically connected to the plurality of channel structures; and
a peripheral circuit area including peripheral circuits configured to control the cell area,
the peripheral circuits are configured to
perform a first programming operation on a first program word line located at a first height in the first direction, the first programing operation including sequentially inputting a voltage of a first level and a voltage of a second level different from the first level to the at least one ground select line, and
perform a second program operation on a second program word line located at a second height, lower than the first height, the second program operation including sequentially inputting a voltage of a third level, lower than the first level and a voltage of a fourth level, lower than the second level, to the at least one ground select line.

16. The semiconductor device of claim 15, wherein each of the second level and the fourth level is a negative level, and an absolute value of the second level is lower than an absolute value of the fourth level.

17. The semiconductor device of claim 16, wherein the peripheral circuits are configured to input a ground voltage to the source region, while the voltage of the second level is input to the ground select line in the first program operation, and
input a ground voltage to the source region while the voltage of the fourth level is input to the ground select line in the second program operation.

18. The semiconductor device of claim 15, wherein the peripheral circuits are configured to input a program voltage to each of the first program word line and the second program word line, after discharging the voltage input to the at least one ground select line in each of the first program operation and the second program operation.

19. The semiconductor device of claim 18, wherein the peripheral circuits are configured to input a voltage of a level higher than a level of a ground voltage to the source region while inputting a program voltage to each of the first program word line and the second program word line.

20. A semiconductor device comprising:
a plurality of ground select transistors connected to a common source line and a ground select line;
a plurality of string select transistors connected to a plurality of bit lines and at least one string select line;
a plurality of memory cells connected to each other in series between the plurality of ground select transistors and the plurality of string select transistors, and connected to a plurality of word lines; and
a row decoder configured to control the plurality of ground select transistors, the plurality of string select transistors, and the plurality of memory cells,
the row decoder is configured to input a first program voltage for a first program time and input a second program voltage for a second program time after the first program time, to a program word line connected to a selected memory cell among the plurality of memory cells, and
the row decoder is configured to determine absolute values of voltages respectively input to the ground select line and the common source line in the first program time and the second program time, respectively, based on respective magnitudes of the first program voltage and the second program voltage.

* * * * *